(12) United States Patent
Zhao et al.

(10) Patent No.: US 12,093,535 B2
(45) Date of Patent: Sep. 17, 2024

(54) MEMORY DEVICE, MEMORY SYSTEM, AND PROGRAM OPERATION METHOD THEREOF

(71) Applicant: YANGTZE MEMORY TECHNOLOGIES CO., LTD., Wuhan (CN)

(72) Inventors: Xiangnan Zhao, Wuhan (CN); Hongtao Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 99 days.

(21) Appl. No.: 17/942,108

(22) Filed: Sep. 9, 2022

(65) Prior Publication Data

US 2023/0176748 A1    Jun. 8, 2023

Related U.S. Application Data

(63) Continuation of application No. PCT/CN2022/112987, filed on Aug. 17, 2022.

(30) Foreign Application Priority Data

Dec. 2, 2021    (CN) .......................... 202111461490.1

(51) Int. Cl.
*G06F 3/06* (2006.01)

(52) U.S. Cl.
CPC .......... *G06F 3/0619* (2013.01); *G06F 3/0653* (2013.01); *G06F 3/0659* (2013.01); *G06F 3/0679* (2013.01)

(58) Field of Classification Search
CPC ........ G06F 3/06; G06F 3/0653; G06F 3/0619; G06F 3/0679; G06F 3/0659
See application file for complete search history.

(56) References Cited

U.S. PATENT DOCUMENTS

| 10,796,774 B2 | 10/2020 | Shi et al. |
| 11,182,080 B2 | 11/2021 | Zhuang et al. |

(Continued)

FOREIGN PATENT DOCUMENTS

| CN | 102150216 A | 8/2011 |
| CN | 104332178 A | 2/2015 |

(Continued)

OTHER PUBLICATIONS

K. Takeuchi and T. Tanaka, "A dual-page programming scheme for high-speed multigigabit-scale NAND flash memories," in IEEE Journal of Solid-State Circuits, vol. 36, No. 5, pp. 744-751, May 2001.*

(Continued)

*Primary Examiner* — Pierre Michel Bataille
(74) *Attorney, Agent, or Firm* — BAYES PLLC

(57) ABSTRACT

A memory device includes a memory cell array and peripheral circuits. The memory cell array may include one or more first memory cells configured to store first type data, and one or more second memory cells configured to store second type data. The peripheral circuits may be coupled to the memory cell array and configured to perform a first program operation on the one or more first memory cells, perform the first program operation on the one or more second memory cells, and perform a second program operation on the one or more first memory cells. A first storage time corresponding to the first type data is longer than a second storage time corresponding to the second type data.

20 Claims, 15 Drawing Sheets

(56) References Cited

U.S. PATENT DOCUMENTS

| | | | |
|---|---|---|---|
| 11,249,791 B2* | 2/2022 | Sergeev | G06F 9/45558 |
| 2005/0270817 A1* | 12/2005 | Takeuchi | G11C 16/10 |
| | | | 365/11 |
| 2016/0035427 A1* | 2/2016 | Yu | G11C 16/10 |
| | | | 365/185.11 |
| 2016/0078945 A1 | 3/2016 | Kim et al. | |
| 2017/0076802 A1 | 3/2017 | Mokhlesi | |
| 2019/0369921 A1* | 12/2019 | Oh | G11C 16/0483 |
| 2020/0201549 A1* | 6/2020 | Malina | G06F 3/0659 |
| 2021/0043263 A1* | 2/2021 | Zhang | G11C 16/08 |
| 2022/0261164 A1* | 8/2022 | Zhuravlev | G06F 3/0638 |
| 2023/0152997 A1* | 5/2023 | Nam | G06F 3/0673 |
| | | | 711/154 |

FOREIGN PATENT DOCUMENTS

| | | | |
|---|---|---|---|
| CN | 110036446 A | | 7/2019 |
| CN | 110870015 A | | 3/2020 |
| CN | 114400035 A | | 4/2022 |
| WO | 2015185002 A1 | | 12/2015 |
| WO | WO-2018080615 A1 * | | 5/2018 ............ G11C 11/00 |
| WO | WO-2019240851 A1 * | | 12/2019 ......... G11C 16/0408 |

OTHER PUBLICATIONS

Ashok K. Sharma, "High Performance Dynamic Random Access Memories," in Advanced Semiconductor Memories: Architectures, Designs, and Applications, IEEE, 2003, pp. 129-235, ch3.*

H. Bazzi, H. Aziza, M. Moreau and A. Harb, "Design of a Novel Hybrid CMOS Non-Volatile SRAM Memory in 130nm RRAM Technology," 2020 15th Design & Technology of Integrated Systems in Nanoscale Era (DTIS), Marrakech, Morocco, 2020, pp. 1-6.*

Joe Brewer; Manzur Gill, "NAND Flash Memory Technology," in Nonvolatile Memory Technologies with Emphasis on Flash: A Comprehensive Guide to Understanding and Using Flash Memory Devices, IEEE, 2008, pp. 223-311.*

Ashok K. Sharma, "Advanced Nonvolatile Memory Designs and Technologies," in Advanced Semiconductor Memories: Architectures, Designs, and Applications, IEEE, 2003, pp. 319-477.*

International Search Report issued in corresponding International Application No. PCT/CN2022/112987, mailed Nov. 18, 2022, 4 pages.

* cited by examiner

MEMORY DEVICE, MEMORY SYSTEM, AND PROGRAM OPERATION METHOD THEREOF

CROSS-REFERENCE TO RELATED APPLICATIONS

This application is a continuation of International Application No. PCT/CN2022/112987, filed on Aug. 17, 2022, entitled "MEMORY DEVICE, MEMORY SYSTEM, AND PROGRAM OPERATION METHOD THEREOF," which claims the benefit of priority to Chinese Application No. 202111461490.1, filed on Dec. 2, 2021, both of which are incorporated herein by reference in their entireties.

BACKGROUND

The present disclosure relates to memory devices, memory systems, and program operation methods thereof.

With the development of 5G New Radio (NR) and big data, the demand for memory capacity has been increasing. For example, three-dimensional (3D) NAND flash memory devices that improve the bit density while reducing the bit cost have been developed and introduced to the market. In order to pursue a higher memory storage density, the number of memory stacks and the number of storage bits in a single memory cell are correspondingly becoming larger, which poses a huge challenge to the reliability of the memory devices and even leads to data loss in some situations.

In the process of programming data into these 3D NAND memory devices, a portion of the charges may be tied to some traps that have shallow energy levels. At the end of the programming, these charges may escape from the traps and migrate to the conductive channel. As a result, the threshold voltage after the programming may drift to a lower value, which makes the threshold voltage distribution to become wider, thereby damaging the reliability of the memory devices.

SUMMARY

In one aspect of the present disclosure, a memory device is disclosed. The memory device may include a memory cell array and peripheral circuits. The memory cell array may include one or more first memory cells configured to store first type data, and one or more second memory cells configured to store second type data. The peripheral circuits may be coupled to the memory cell array and configured to perform a first program operation on the one or more first memory cells, perform the first program operation on the one or more second memory cells, and perform a second program operation on the one or more first memory cells. A first storage time corresponding to the first type data may be longer than a second storage time corresponding to the second type data.

In some implementations, the second program operation may be configured to adjust a threshold voltage range corresponding to the one or more first memory cells to become narrower than in the first program operation.

In some implementations, a first target programming state achieved by the first program operation on the one or more first memory cells may be substantially identical to a second target programming state achieved by the second program operation on the one or more first memory cells.

In some implementations, the first program operation may include a first programming pulse that may have a first pulse voltage and a first pulse duration, and the second program operation may include a second programming pulse that may have a second pulse voltage and a second pulse duration. At least one of the first pulse voltage being substantially identical to the second pulse voltage or the first pulse duration being substantially identical to the second pulse duration may be satisfied.

In some implementations, the first pulse voltage may include a first initial pulse voltage and one or more first incremental voltages, and the second pulse voltage may include a second initial pulse voltage and one or more second incremental voltages. Each of the first initial pulse voltage and the one or more first incremental voltages may be substantially identical to a corresponding one of the second initial pulse voltage and the one or more second incremental voltages.

In some implementations, the peripheral circuits may be configured to: after applying each of the first initial pulse voltage and the one or more first incremental voltages to the one or more first memory cells, apply a verification voltage to a word line corresponding to the one or more first memory cells to verify whether the first program operation on the one or more first memory cells is successful to enable the one or more first memory cells to reach the first target programming state.

In some implementations, the peripheral circuits may be configured to: in response to a storage time of data to be programmed being longer than a preset duration, determine the data to be the first type data; and in response to the storage time of data being shorter than or equal to the preset duration, determine the data to be the second type data.

In some implementations, the peripheral circuits may be configured to: apply a programming voltage to a word line corresponding to the one or more first memory cells, and a pass voltage to other word lines corresponding to the one or more second memory cells to perform the first program operation on the one or more first memory cells.

In some implementations, the peripheral circuits may be configured to perform the first program operation on the one or more first memory cells and the first program operation on the one or more second memory cells sequentially.

In some implementations, the peripheral circuits may be configured to perform the second program operation on the one or more first memory cells before performing the first program operation on the one or more second memory cells.

In some implementations, the peripheral circuits may be configured to perform the second program operation on the one or more first memory cells after performing the first program operation on the one or more second memory cells.

In some implementations, the peripheral circuits may be configured to perform the first program operation on the one or more first memory cells and the first program operation on the one or more second memory cells parallelly.

In some implementations, the one or more first memory cells may include a plurality of first memory cells. The peripheral circuits may be configured to: verify whether the first program operation on at least one first memory cell of the plurality of first memory cells is successful based on applying a verification voltage to a word line corresponding to the at least one first memory cell, and after a determination that the first program operation on the at least one first memory cell is successful, perform the second program operation on the at least one first memory cell.

In some implementations, the one or more first memory cells may include a plurality of first memory cells in one memory string. The peripheral circuits may be configured to: after the first program operation on the plurality of first memory cells in the memory string is successful, perform the second program operation on the plurality of first memory cells in the memory string.

In some implementations, the peripheral circuits may be configured to perform the first program operation on one first memory cell, closer to a substrate, in the memory string, before performing the first program operation on another first memory cell, more distant from the substrate, in a same memory string.

In some implementations, the one or more first memory cells may include a plurality of first memory cells in one memory page. The peripheral circuits may be configured to after the first program operation on the plurality of first memory cells in the memory page is successful, perform the second program operation on the plurality of first memory cells in the memory page.

In some implementations, the peripheral circuits may be configured to perform the first program operation on the plurality of first memory cells in the memory page before performing the first program operation on other first memory cells, more distant from a substrate, in another memory page.

In some implementations, the one or more first memory cells may include a plurality of first memory cells in one block. The peripheral circuits may be configured to: after the first program operation on the plurality of first memory cells in the block is successful, perform the second program operation on the plurality of first memory cells in the block.

In some implementations, the peripheral circuits may be configured to perform the first program operation on a first portion of the first memory cells, closer to a substrate, in the block before performing the first program operation on a second portion of the first memory cells, more distant from the substrate, in the block.

In another aspect of the present disclosure, a memory system is disclosed. The memory system may include one or more memory devices. Each of the one or more memory devices may include a memory cell array, peripheral circuits coupled to the memory cell array, and a memory controller. The memory cell array may include one or more first memory cells configured to store first type data, and one or more second memory cells configured to store second type data. The memory controller may be coupled to the one or more memory devices and configured to send a programming instruction signal to one of the one or more memory devices. In response to the programming instruction signal, the peripheral circuits of a corresponding memory device may be configured to: perform a first program operation on the one or more first memory cells; perform the first program operation on the one or more second memory cells; and perform a second program operation on the one or more first memory cells. A first storage time corresponding to the first type data may be longer than a second storage time corresponding to the second type data.

In still another aspect of the present disclosure, a method for programming data is disclosed. The method may include performing a first program operation on one or more first memory cells and performing the first program operation on one or more second memory cells, the one or more first memory cells being configured to store first type data, and the one or more second memory cells being configured to store second type data; and performing a second program operation on the one or more first memory cells. A first storage time corresponding to the first type data may be longer than a second storage time corresponding to the second type data.

In some implementations, the second program operation may be configured to adjust a threshold voltage range corresponding to the one or more first memory cells to become narrower than in the first program operation.

In some implementations, a first target programming state achieved by the first program operation on the one or more first memory cells may be substantially identical to a second target programming state achieved by the second program operation on the one or more first memory cells.

In some implementations, the first program operation may include a first programming pulse that may have a first pulse voltage and a first pulse duration, and the second program operation may include a second programming pulse that may have a second pulse voltage and a second pulse duration. At least one of the first pulse voltage being substantially identical to the second pulse voltage or the first pulse duration may be substantially identical to the second pulse duration may be satisfied.

In some implementations, the first pulse voltage may include a first initial pulse voltage and one or more first incremental voltages, and the second pulse voltage may include a second initial pulse voltage and one or more second incremental voltages. Each of the first initial pulse voltage and the one or more first incremental voltages may be substantially identical to a corresponding one of the second initial pulse voltage and the one or more second incremental voltages.

In some implementations, the method may further include: after applying each of the first initial pulse voltage and the one or more first incremental voltages to the one or more first memory cells, applying a verification voltage to a word line corresponding to the one or more first memory cells to verify whether the first program operation on the one or more first memory cells is successful to enable the one or more first memory cells to reach the first target programming state.

In some implementations, the method may further include: in response to a storage time of data to be programmed being longer than a preset duration, determining the data to be the first type data; and in response to the storage time of data being shorter than or equal to the preset duration, determining the data to be the second type data.

In some implementations, the method may further include: applying a programming voltage to a word line corresponding to the one or more first memory cells, and a pass voltage to other word lines corresponding to the one or more second memory cells to perform the first program operation on the one or more first memory cells.

In some implementations, performing the first program operation on the one or more first memory cells and the one or more second memory cells may include performing the first program operation on the one or more first memory cells and the first program operation on the one or more second memory cells sequentially.

In some implementations, performing the first program operation on the one or more first memory cells and the one or more second memory cells sequentially may include performing the second program operation on the one or more first memory cells before performing the first program operation on the one or more second memory cells.

In some implementations, performing the first program operation on the one or more first memory cells and the one or more second memory cells sequentially may include performing the second program operation on the one or more first memory cells after performing the first program operation on the one or more second memory cells.

In some implementations, performing the first program operation on the one or more first memory cells and the one or more second memory cells may include performing the first program operation on the one or more first memory cells and the first program operation on the one or more second memory cells parallelly.

In some implementations, the one or more first memory cells may include a plurality of first memory cells. The method may further include verifying whether the first program operation on at least one first memory cell of the plurality of first memory cells is successful based on applying a verification voltage to a word line corresponding to the at least one first memory cell; and after a determination that the first program operation on the at least one first memory cell is successful, performing the second program operation on the at least one first memory cell.

In some implementations, the one or more first memory cells may include a plurality of first memory cells in one memory string. The method further may include after the first program operation on the plurality of first memory cells in the memory string is successful, performing the second program operation on the plurality of first memory cells in the memory string.

In some implementations, performing the first program operation on the plurality of first memory cells may include performing the first program operation on one first memory cell, closer to a substrate, in the memory string, before performing the first program operation on another first memory cell, more distant from the substrate, in a same memory string.

In some implementations, the one or more first memory cells may include a plurality of first memory cells in one memory page. The method further may include after the first program operation on the plurality of first memory cells in one memory page is successful, performing the second program operation on the plurality of first memory cells in the memory page.

In some implementations, performing the first program operation on the plurality of first memory cells may include performing the first program operation on the plurality of first memory cells in the memory page before performing the first program operation on other first memory cells, more distant from a substrate, in another memory page.

In some implementations, the one or more first memory cells may include a plurality of first memory cells in one block. The method may further include after the first program operation on the plurality of first memory cells in the block is successful, performing the second program operation on the plurality of first memory cells in the block.

BRIEF DESCRIPTION OF THE DRAWINGS

The accompanying drawings, which are incorporated herein and form a part of the specification, illustrate some aspects of the present disclosure and, together with the description, further serve to explain the principles of the present disclosure and to enable a person skilled in the pertinent art to make and use the present disclosure.

Figure 1:
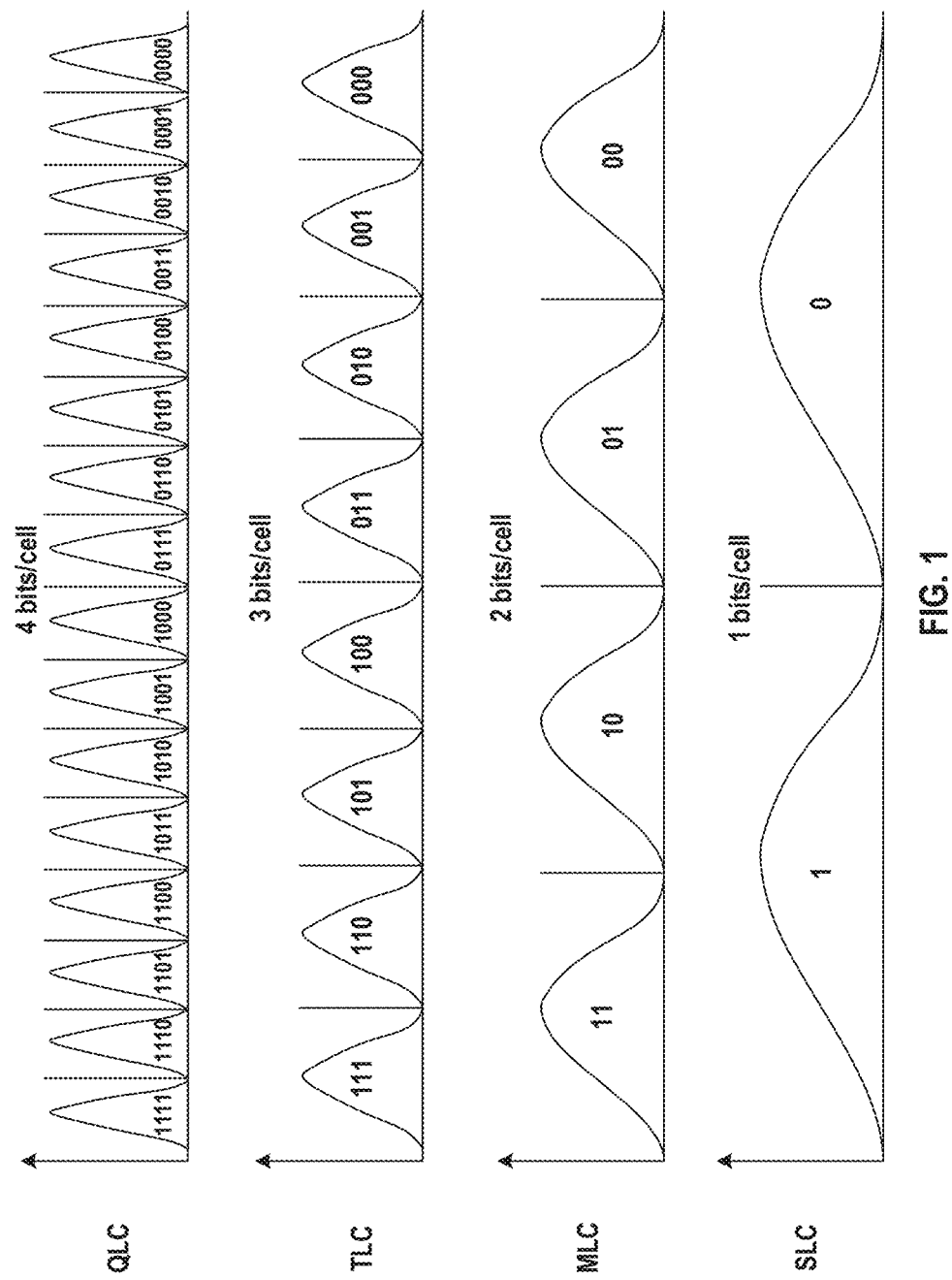
FIG. 1 illustrates a schematic diagram showing various storage types of memory cells.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense.

Similarly, terms, such as "a," "an," or "the," again, may be understood to convey a singular usage or to convey a plural usage, depending at least in part upon context. In addition, the terms "based on" and "according to" may be understood as not necessarily intended to convey an exclusive set of factors and may, instead, allow for the existence of additional factors not necessarily expressly described, again, depending at least in part on the context. In addition, the term "couple," "coupled to," or "coupled between" may be understood as not necessarily intended to be "physically joined or attached," i.e., direct attachment, but can also be interpreted by indirect connection through an intermediate component.

Further, the terms "vertical" and "horizontal" may be only used for ease of description. These directions may be relative to a pre-defined coordinate system or a specific direction (e.g., a layout of a drawing). It can be understood that these directions are not absolute and are only provided for reference.

Non-volatile memory devices that consume less power, have lightweight, and produce reliable performance, such as three-dimensional (3D) NAND memory devices, are widely employed in the related technology fields. FIG. 1 illustrates a schematic diagram showing various storage types of memory cells, e.g., based on NAND memory devices. As shown in FIG. 1, in some examples, memory cells may be categorized, according to the number of bits of programmed data in one memory cell, into a single-level cell (SLC) storing 1-bit data, a multi-level cell (MLC) storing 2-bit data, a triple-level cell (TLC) storing 3-bit data, and a quad-level cell (QLC) storing 4-bit data. Among them, the SLC may have the longest write/erase (P/E) cycle, so its reliability and durability can be the best but costly. By contrast, the TLC or QLC may have shorter PE cycles with average reliability and durability, but at a lower cost.

Figure 2:
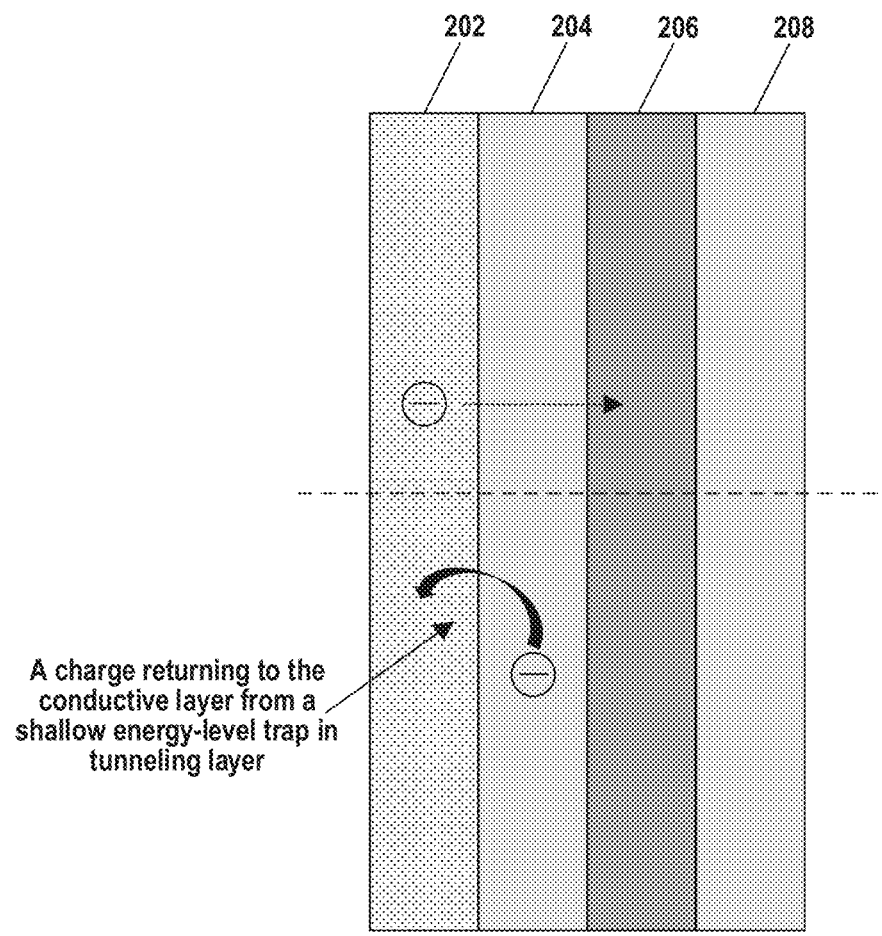
FIG. 2 illustrates a schematic diagram showing a charge trap type memory cell.

In other examples, according to the types for storing charges, NAND memory devices, e.g., can also be divided into memory devices with floating-gate type memory cells and memory devices with charge-trap type memory cells. FIG. 2 illustrates a schematic diagram showing a charge-trap type memory cell that may include a conductive channel 202, a tunneling layer 204, a storage layer 206, and a barrier layer 208. Data programmed into a memory cell can be viewed as a process, under the influence of the electric field, of injecting charges from conductive channel 202, through tunneling layer 204, into storage layer 206. A huge number of traps may exist in storage layer 206, which can capture the injected charges to storage layer 206. It is noted that the deeper the energy level of a trap is, the better charge retention characteristics the trap may have. That is, it is more unlikely for the charges in the deeper energy-level trap to be detached, even when the external electric field changes.

Figure 3:
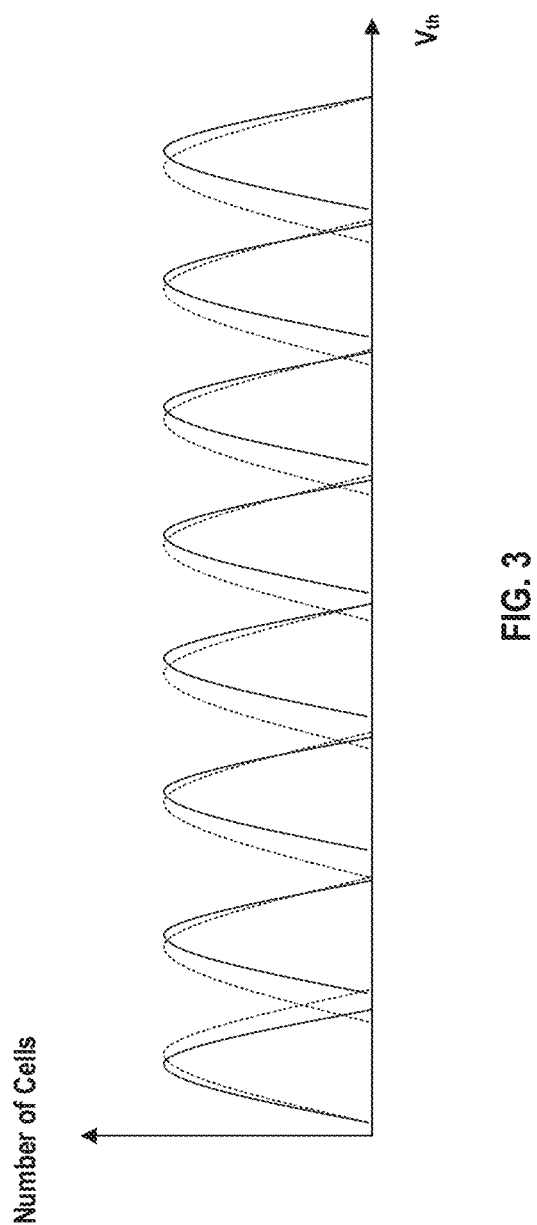
FIG. 3 illustrates a schematic diagram of a change in a threshold voltage distribution due to an influence of trapped charges in a tunneling layer.

In real situations, the characteristics of each memory cell may not be exactly the same. For example, the traps in memory cells may be associated with various energy levels. Some memory cells may include the storage layers having shallow energy-level traps, resulting in poor charge retention characteristics. Some traps may even exist in the tunneling layers, and the charges migrating during the programming process can be trapped in the tunneling layers. At the end of programming, these charges may de-trap from the tunneling layers, during a short period, due to a change of the electric field and return to conductive channel 202, as illustrated in FIG. 2. As a result, the threshold voltage of one memory cell can drift towards a lower level, causing its threshold voltage distribution to become wider, in a trend from the solid curve to the dotted curve, as shown in FIG. 3 The wider threshold voltage distribution can significantly affect the reliability of the memory devices.

In order to address the above and other issues, the present disclosure provides a program operation scheme, in which memory cells may be programmed according to the type of data to be programmed into the memory cells. More specifically, according to an access frequency to the data, the data programmed into the memory cells may be categorized into cold data and hot data. The term "cold data" herein may be used to refer to data whose access frequency is less than a pre-set value that represents a threshold frequency. In another interpretation, the term "first type data" may be used to refer to the data that may have a storage time greater than a preset duration, whereas the term "second type data" may refer to data with a storage time less than or equal to the preset duration. The preset duration may include the shortest duration in which data is required to store in a memory device in a practical application. That is, the term "storage time" herein may be used to describe a time duration for retaining data.

Regarding cold data, it can be expected that its storage time may be relatively longer. By contrast, the term "hot data" herein may refer to some data that is accessed more frequently than the pre-set value and thus may have a relatively shorter storage time. Accordingly, the memory cells may be categorized according to the data that the memory cells are configured to program in practical applications. In some examples, a memory cell may be a first memory cell configured for storing a first type of data (or termed "first type data") or a second memory cell configured for storing a second type of data (or termed "second type data"), where the first type of data may include cold data and the second type of data may include hot data. In other words, the first memory cell may be configured to store data associated with a longer storage time, while the second memory cell may be configured to store data associated with a shorter storage time. It can also be understood that the first and second memory cells are configured for storing data, and thus they may include main memory cells instead of dummy memory cells.

In view of the above, the present disclosure provides a program operation method, in which, for the first memory cell that stores the first type data, an additional program operation may be performed after a program operation on the first memory cell. The term "first type data" herein may be used to refer to the cold data described above, which may require a longer storage time and thus need a higher requirement for the charge retention ability.

In the additional program operation (or the second program operation), one or more programming pulses may be applied to a selected word line corresponding to the first memory cell, and a pass voltage may be applied to a word line corresponding to the second memory cell. As such, an electric field may be generated between the gate layer and the conductive channel of the first memory cell. Consequently, in the first memory cell, the charges in the conductive channel may be captured into the storage layer. Upon the first program operation, the first memory cell may reach a target programming state and show a corresponding threshold voltage range. It can be noted that upon the second program operation, the target programming state of the first memory cell can remain unchanged but the corresponding threshold voltage range may become narrower, thereby improving the results of storing data.

That is, through the two program operations on the first memory cell that requires a longer storage time, the chances for the charges to be restrained in the shallow energy-level traps can be reduced, and the charges can be motivated to return to the conductive channel. Therefore, the first type data may be better maintained in the first memory cell, thus reducing the bit error rate and improving the reliability of the memory device.

Figure 4:
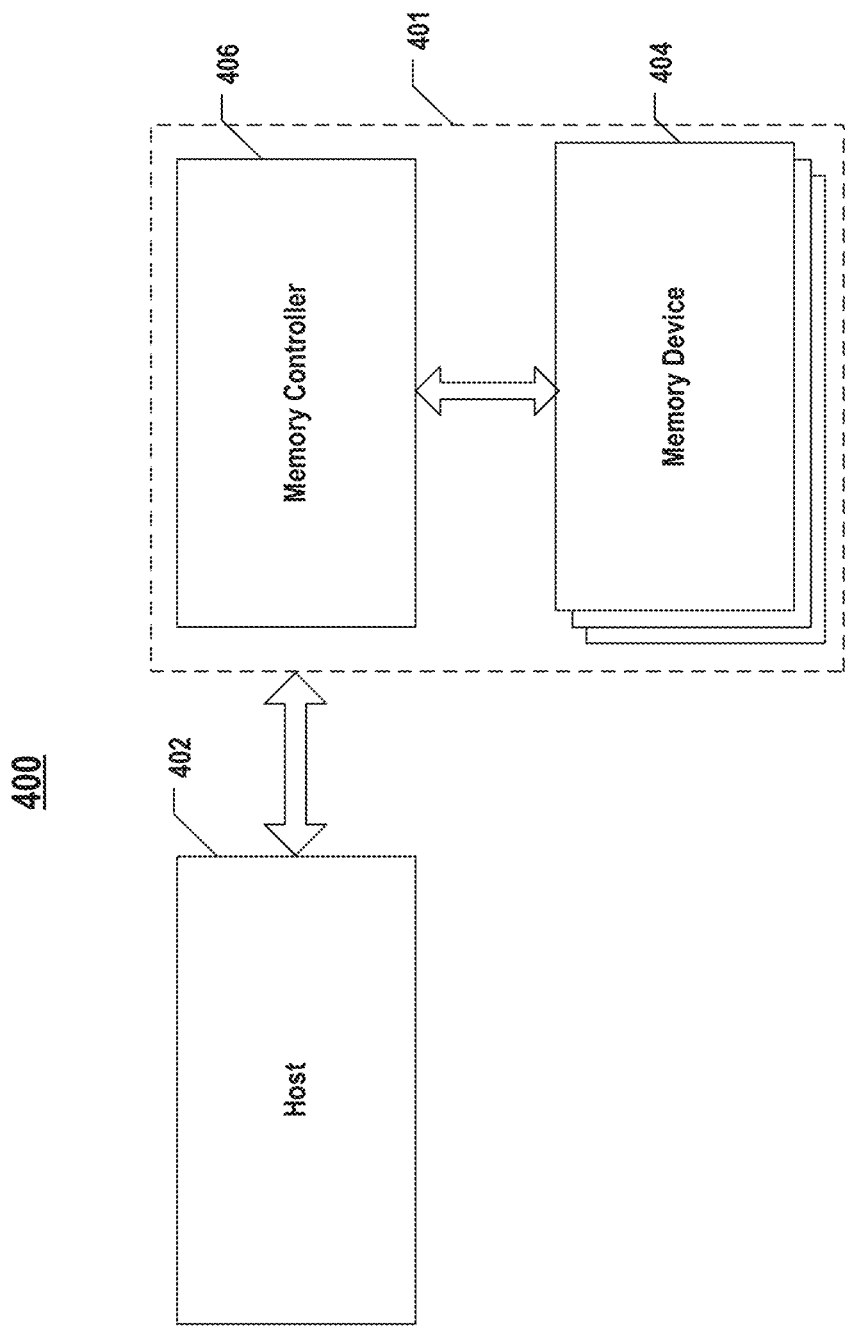
FIG. 4 illustrates a block diagram of an exemplary memory system having a storage system, according to some implementations of the present disclosure.

FIG. 4 illustrates a block diagram of an exemplary memory system 400 having a storage system 401, according to some implementations of the present disclosure. Memory system 400 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 4, memory system 400 can include a host 402 and storage system 401 having one or more memory devices 404 and a memory controller 406. Host 402 can be a processor of an electronic device (such as a central processing unit, CPU), or a system-on-chip (SoC) (such as an application processor, AP). In some implementations, host 402 can be configured to send or receive data to or from memory devices 404. In some implementations, host 402 can be a user logic, or a user interface such that the user may give instructions to host 402 and transmit the instructions to the memory devices or the memory array.

Memory device 404 can be any memory device disclosed in the present disclosure. As disclosed below in detail, memory device 404, such as NAND Flash memory device, dynamic random access memory (DRAM), or phase-change random access memory (PCRAM) can include a clock input, a command bus, a data bus, a control logic, an address register, a row decoder/word line driver, a memory cell array having memory cells, a voltage generator, a page buffer/sense amplifier, a column decoder/bit line driver, a data input/output (I/O), according to some implementations.

Memory controller 406 may be coupled to memory device 404 and host 402 and may be configured to control memory device 404, according to some implementations. Memory controller 406 can manage the data stored in memory device 404 and communicate with host 402. In some implementations, memory controller 406 may be designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 406 may be designed for operating in a high duty-cycle environment solid-state drives (SSDs) or embedded multi-media-cards (eMMCs) used as data storage for mobile devices, such as smartphones, tablets, laptop computers, etc., and enterprise storage arrays. Memory controller 406 can be configured to control operations of memory device 404, such as read, erase, and write operations. Memory controller 406 can also be configured to manage various functions with respect to the data stored or to be stored in memory device 404 including, but not limited to bad-block management, garbage collection, logical-to-physical address conversion, wear leveling, etc. In some implementations, memory controller 406 may be further configured to process error correction codes (ECCs) with respect to the data read from or written to memory device 404. Memory controller 406 may perform any other suitable functions as well, for example, formatting memory device 404. Memory controller 406 can communicate with an external device (e.g., host 402) according to a particular communication protocol. For example, memory controller 406 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc. Furthermore, memory controller 406 can also be configured to receive a command from, transmit data to host 402, and perform multiple functions according to some implementations of the present disclosure.

Figure 5A:
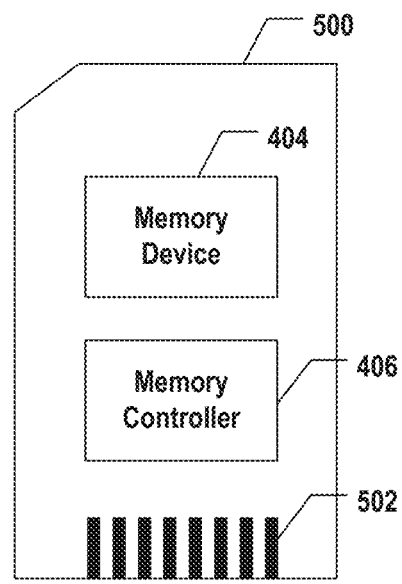
FIG. 5A illustrates a diagram of an exemplary memory card having a memory device, according to some implementations of the present disclosure.
Figure 5B:
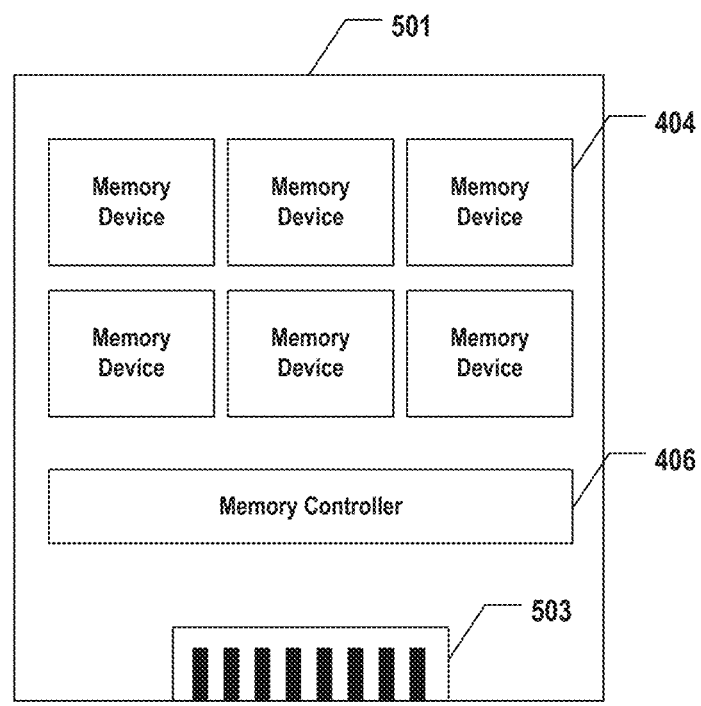
FIG. 5B illustrates a diagram of an exemplary solid-state drive (SSD) having a plurality of memory devices, according to some implementations of the present disclosure.

Memory controller 406 and one or more memory devices 404 can be integrated into various types of storage devices, for example, being included in the same package, such as a universal Flash storage (UFS) package or an eMMC package. That is, memory system 400 can be implemented and packaged into different types of end electronic products. In one example as shown in FIG. 5A, memory controller 406 and a single memory device 404 may be integrated into a memory card 500. Memory card 500 can include a PC card (personal computer memory card international association, PCMCIA), a CF card, a smart media (SM) card, a memory stick, a multimedia card (MMC, RS-MMC, MMCmicro), an SD card (SD, miniSD, microSD, SDHC), a UFS, etc. Memory card 500 can further include a memory card connector 502 coupling memory card 500 with a host (e.g., host 402 in FIG. 4). In another example as shown in FIG. 5B, memory controller 406 and multiple memory devices 404 may be integrated into an SSD 501. SSD 501 can further include an SSD connector 503 coupling SSD 501 with a host (e.g., host 402 in FIG. 4). In some implementations, the storage capacity and/or the operation speed of SSD 501 can be greater than those of memory card 500.

Figure 6:
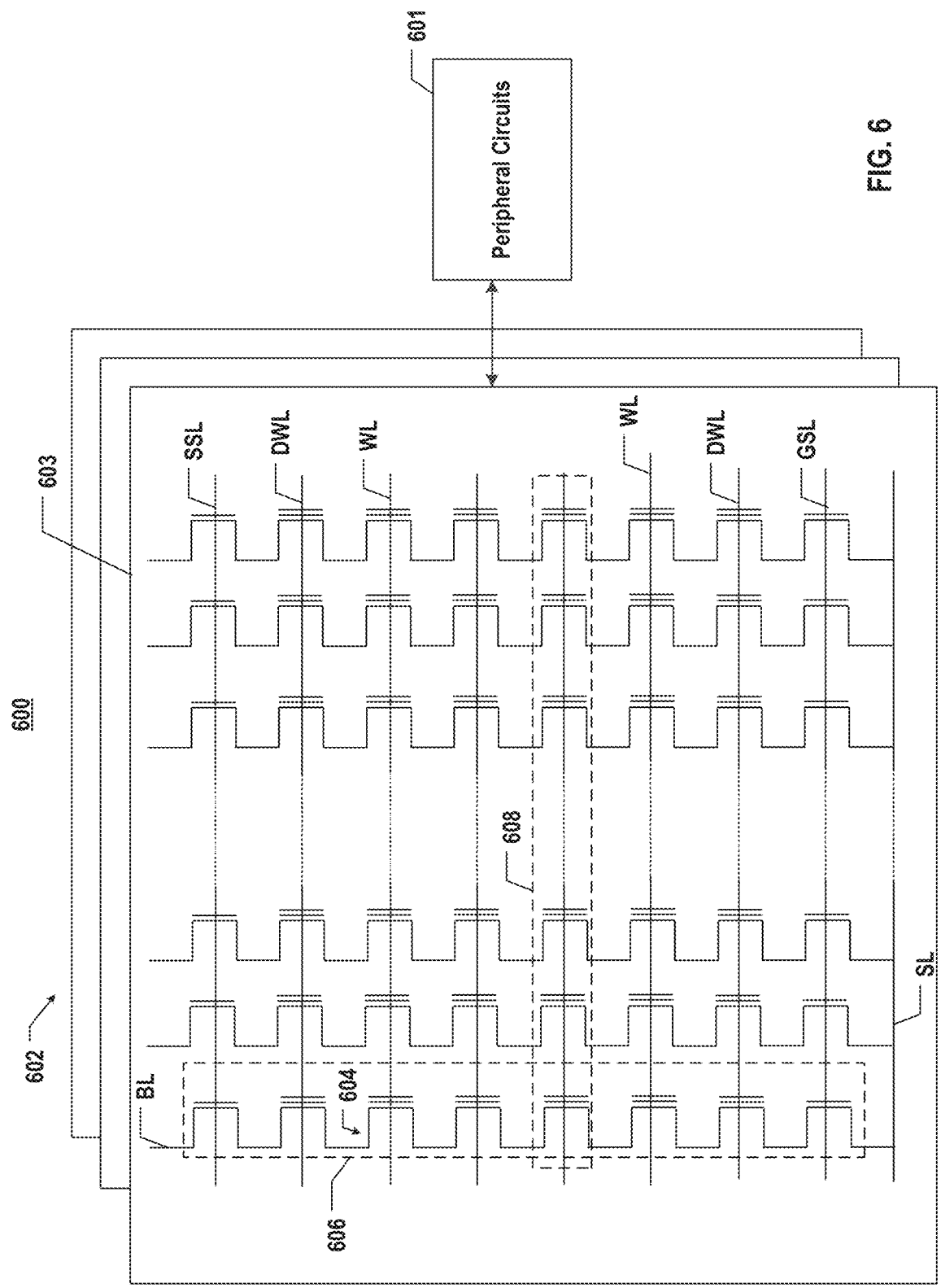
FIG. 6 illustrates a schematic diagram of an exemplary memory device including peripheral circuits and a memory cell array, according to some implementations of the present disclosure.

FIG. 6 illustrates a schematic diagram of an exemplary memory device 600 including peripheral circuits 601 and a memory cell array 602, according to some implementations of the present disclosure. Memory device 600 may include a three-dimensional (3D) NAND memory device, and memory cell array 602 may include a 3D NAND memory cell array. Memory cell array 602 may include one or more memory blocks 603, such as memory block 0, memory block 1, memory block 2, memory block 3, . . . , etc. Each memory block may include a string selection line SSL, a ground selection line GSL, a source line SL, a plurality of word lines WLs, bit lines BLs, and memory cells 604 formed between word lines WLs and bit lines BLs, as shown in FIG. 6. In some instances, the word lines WLs may include one or more main word lines WLs and one or more dummy word lines DWLs, as shown in FIG. 6. In some examples, the one or more dummy word lines DWLs may include one or more top dummy word lines between string selection line SSL and the one or more main word lines WLs, one or more bottom dummy word lines between the one or more main word lines WLs and ground selection line GSL, and one or more intermediate dummy word lines between a first group of the main word lines and a second group of the main word lines.

The 3D NAND memory cell array may include a semiconductor substrate, a memory stack that may include interleaved gate layers and dielectric layers above the semiconductor substrate, and a plurality of channel holes (CH) each extending vertically through the memory stack. A memory film may be formed along a sidewall of the channel hole. The memory film may include barrier layer 208, storage layer 206, tunneling layer 204, conductive channel 202, etc., as shown in FIG. 2. Each memory cell 604 may be formed in an intersection between the memory film and each gate layer.

As shown in FIG. 6, in some implementations, memory cell array 602 in one memory block 603 may be provided in the form of an array of memory strings 606, such as NAND memory strings. In some implementations, each of memory strings 606 may extend vertically above the semiconductor substrate, and each may include a plurality of memory cells 604 coupled in series and stacked vertically. Each memory cell 604 may retain a continuous, analog value, such as an electrical voltage or an electronic charge, which depends on the number of electrons trapped within a region of memory cell 604. Each memory cell 604 can be either a floating type of memory cell having a floating-gate transistor or a charge-trap type of memory cell having a charge-trap transistor.

In some implementations, each memory cell 604 may be a single-level cell (SLC) that may have two possible memory states, thus storing one bit of data. For example, the first memory state "0" may correspond to the first range of voltages, and the second memory state "1" may correspond to the second range of voltages. In some implementations, each memory cell 604 may be a multi-level cell (MLC) that is capable of storing more than a single bit of data in more than four memory states. For example, the MLC can store two bits per cell, three bits per cell (also known as triple-level cell, TLC), or four bits per cell (also known as a quad-level cell, QLC). Each MLC can be programmed to assume a range of possible nominal storage values. In one example, if each MLC stores two bits of data, then the MLC can be programmed to assume one of three possible programming levels from an erased state by writing one of three possible nominal storage values to the memory cell. A fourth nominal storage value can be used for the erased state.

Memory cells 604 of adjacent memory strings 606 in one memory block 603 can be coupled through word lines WLs that select which rows of memory cells 604 to be impacted at, e.g., read and program operations. In some implementations, each word line WL may be connected with memory cells 604 of one page 608, which may be the basic data unit for the program and read operations. The size of one page 608 in bits can correspond to the number of memory strings 606 coupled by one word line WL. Each word line WL may include a gate line configured to couple a plurality of control gates (gate electrodes) of each memory cell 604 in a respective page 608.

In accordance with the scope of the present disclosure, peripheral circuits 601 may be configured to perform the first program operation on the first memory cell. The first memory cell may be configured to store the first type data. The first type data may include an expected storage time longer than the second type data stored in the second memory cell. In some examples, the storage time may be predetermined or pre-detected, so that the memory system can recognize whether a memory cell is a first memory cell or a second memory cell. Further, peripheral circuits 601 may be further configured to perform the second program operation on the first memory cell. In some implementations, a programming pulse in the second program operation may be the same as a programming pulse in the first program operation.

Figure 7:
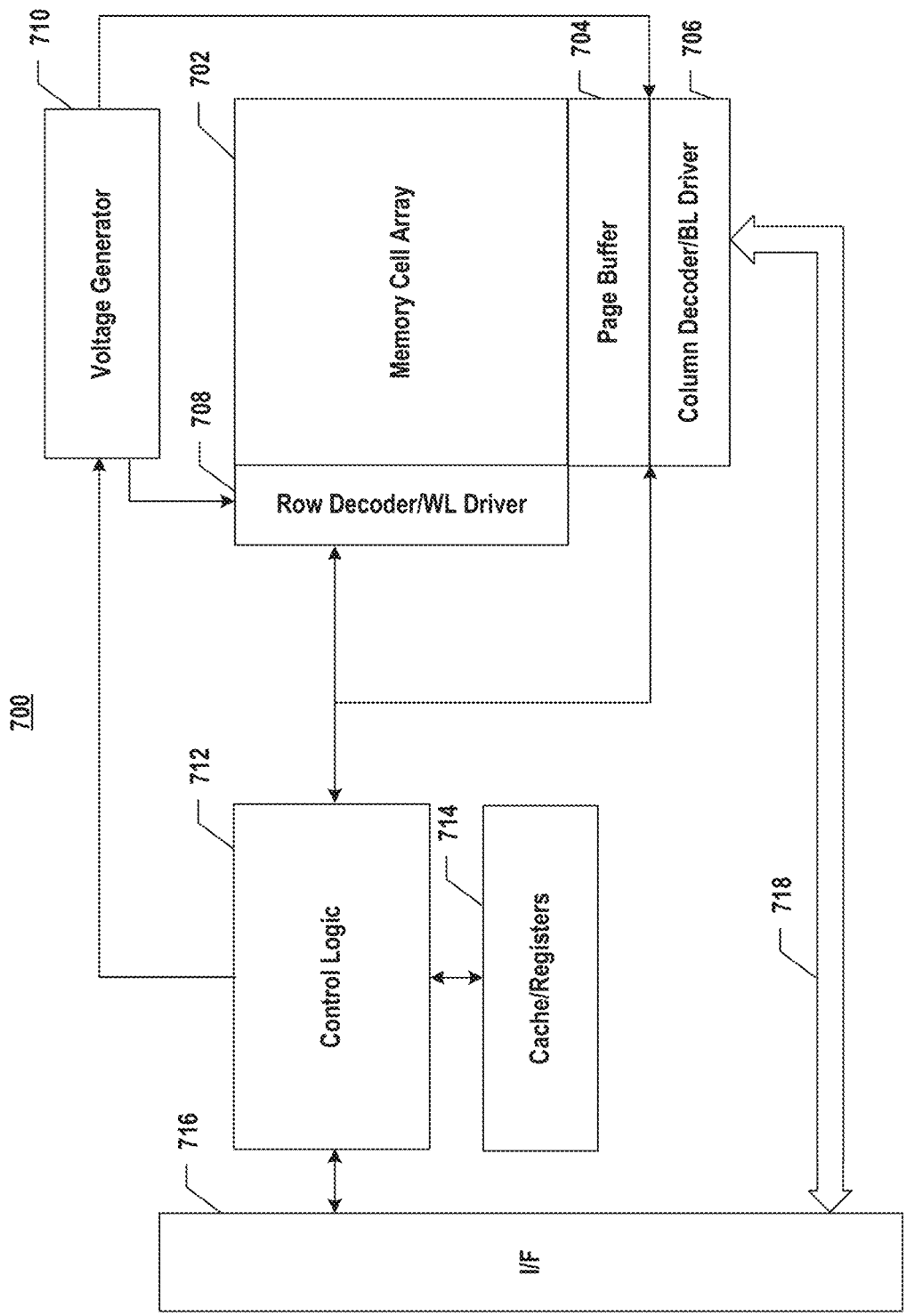
FIG. 7 illustrates a block diagram of an exemplary memory device including a memory cell array and peripheral circuits, according to some implementations of the present disclosure.

FIG. 7 illustrates a block diagram of an exemplary memory device 700 including a memory cell array 702 and peripheral circuits, according to some implementations of the present disclosure. Memory cell array 602 in FIG. 6 can be an example of memory cell array 702 in FIG. 7, while FIG. 7 may depict some examples of peripheral circuits 601 in FIG. 6.

Returning to FIG. 6, peripheral circuits 601 can be coupled with memory cell array 602 through bit lines BLs, word lines WLs, source line SL, string selection line SSL, and ground selection line GSL, etc. Peripheral circuits 601 can include any suitable circuits for facilitating the operations of memory cell array 602 by applying and sensing voltage signals and/or current signals through bit lines BLs to and from each target memory cell 604 through bit lines BLs, word lines WLs, source line SL, string selection line SSL, and ground selection line GSL. Peripheral circuits 601 can include various types of peripheral circuitry formed using complementary metal-oxide-semiconductor (CMOS) technologies. For example, FIG. 7 illustrates some exemplary peripheral circuits 601 that may include a page buffer 704, a column decoder/bit line driver 706, a row decoder/word line driver 708, a voltage generator 710, control logic 712, cache/registers 714, an interface (I/F) 716, and a data bus 718. It can be understood that in some examples, additional circuits may be included as well, such as a sensing amplifier.

Page buffer 704 can be configured to buffer data read from or programmed to memory cell array 702 according to control signals issued by control logic 712. In one example, page buffer 704 may store one page of program data (write data) to be programmed into one page 608 (shown in FIG. 6) of memory cell array 702. In another example, page buffer 704 may also perform program verification operations to ensure that the data has been properly programmed into memory cells 604 coupled to a selected word line.

Row decoder/word line driver 708 can be configured to be controlled by control logic 712 to select a memory block 603 of memory cell array 702 and a word line WL of selected memory block 603. Row decoder/word line driver 708 can be further configured to drive memory cell array 702. For example, row decoder/word line driver 708 may drive memory cells 604 coupled to the selected word line using a voltage generated from voltage generator 710.

Column decoder/bit line driver 706 may be controlled by control logic 712 to select one or more memory strings 606 (shown in FIG. 6) by applying a bit line voltage generated from voltage generator 710. For example, column decoder/bit line driver 706 may apply column signals for selecting a set of N bits of data from page buffer 704 to be outputted in a read operation.

Control logic 712 can be coupled to each peripheral circuit 601 (shown in FIG. 6) and configured to control operations of peripheral circuits 601. Cache/registers 714 can be coupled to control logic 712 and may include status registers, command registers, and address registers for storing status information, command operation codes (OP codes), and command addresses for controlling the operations of each peripheral circuit 601.

Interface 716 can be coupled to control logic 712 and configured to interface memory cell array 702 with a memory controller (shown in FIG. 4). In some implementations, interface 716 may function as a control buffer to buffer and relay control commands received from the memory controller and/or a host (shown in FIG. 4) to control logic 712 and status information received from control logic 712 to the memory controller and/or the host. Interface 716 can also be coupled to page buffer 704 and column decoder/bit line driver 706 via data bus 718 and function as an I/O interface and a data buffer to buffer and relay the program data received from the memory controller and/or the host to page buffer 704 and the read data from page buffer 704 to the memory controller and/or the host. In some implementations, interface 716 and data bus 718 can be parts of an I/O circuit of peripheral circuits 601.

Voltage generator 710 may be controlled by control logic 712 to generate word line voltages (e.g., read voltage, programming voltage, pass voltage, local voltage, and verification voltage) and bit line voltages to be supplied to memory cell array 702. In some implementations, voltage generator 710 can be part of a voltage source that provides voltages at various levels of different peripheral circuits 601 as described below in detail. Consistent with the scope of the present disclosure, in some implementations, the voltages provided by voltage generator 710, for example, to row decoder/word line driver 708, column decoder/bit line driver 706, and page buffer 704 may be above certain levels that can be sufficient to perform the memory operations. For example, the voltages provided to the page buffer circuits in page buffer 704 and/or the logic circuits in control logic 712 may be, e.g., between 1.3 V and 5 V, such as 3.3 V, and the voltages provided to the driving circuits in row decoder/word line driver 708 and/or column decoder/bit line driver 706 may be, e.g., between 5 V and 30 V. In some implementations, voltage generator 710 may be further configured to generate programming voltages and pass voltages supplied to control terminals of the first memory cell and the second memory cell so as to achieve the desired purposes and functions consistent with the scope of the present disclosure.

Figure 8A:
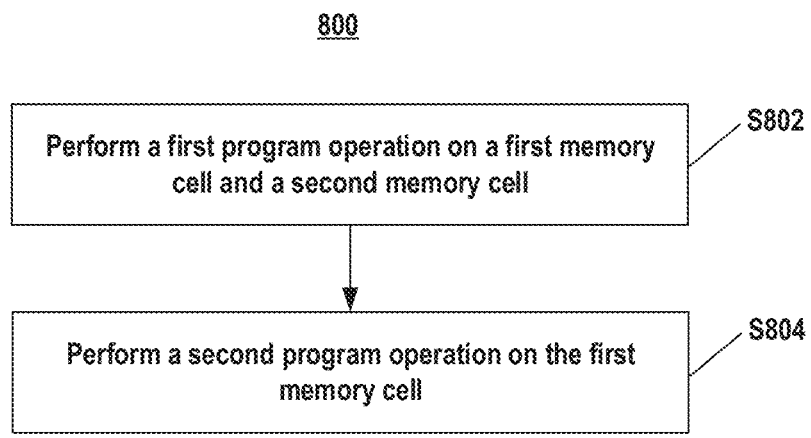
FIG. 8A illustrates a flow diagram showing a first exemplary program operation method on a memory device, according to some implementations of the present disclosure.

FIG. 8A illustrates a flow diagram showing a first exemplary program operation method 800 performed on a memory device, according to some implementations of the present disclosure. Method 800 may first proceed to S802, where a first program operation may be performed on a first memory cell and a second memory cell. The first and second memory cells may be programmed with the first program operation parallelly or sequentially.

The first memory cell may be configured to store a first type data, and the second memory cell may be configured to store a second type data. A first storage time corresponding to the first type data may be longer than a second storage time corresponding to the second type data. In some examples, these storage times may be predetermined or pre-detected, so that the memory system can recognize whether a memory cell is a first memory cell or a second memory cell.

Method 800 may further proceed to S804. A second program operation may be performed on the first memory cell. In some implementations, a first target programming state of the first program operation and a second target programming state of the second program operation may be substantially identical.

In some implementations, the term "memory device" in the present disclosure may refer to a memory device that is configured to program, read, and erase data, such as NAND Flash Memory, NOR Flash Memory, Dynamic Random Access Memory (DRAM), Ferroelectric Random Access Memory (FRAM), Magneto resistive Random Access Memory (MRAM), Phase Change Random Access Memory (PCRAM), Resistive Random Access Memory (RRAM), etc. The memory device may include a memory cell array and a control logic, as described above. The read, write, verification, and other operations of the memory cell array may be controlled by a plurality of word lines WLs and a plurality of bit lines BLs, as shown in FIG. 6. Memory cell array 602 may include a plurality of memory strings 606, and each memory string 606 may further include a plurality of memory cells 604. As described above, each memory cell 604 may be formed in the intersection of and connected through a corresponding word line WL and a corresponding bit line BL. A bit line signal can be applied to a source of the memory cell, and the word line signal can be applied to a gate (or a control terminal) of the memory cell. In some examples, the term "memory cell" herein may refer to a non-volatile storage unit in the memory device.

Returning to FIG. 8A, at S802, the first program operation may be performed on the first and second memory cells. In the process of performing the first program operation, the first and second memory cells can be programmed respectively until corresponding target programming states thereof are reached to pass corresponding verification operations. In some implementations, the first memory cell may be first programmed, and subsequently, the first program operation may be performed on the second memory cell. In other implementations, the first program operation may be first performed on the second memory cell and then on the first memory cell. It can be understood that the present disclosure does not limit the programming sequence and timing for the first program operation on the first and second memory cells. In still other implementations, there may exist other manners that can achieve the same results, the methods of which may still fall into the scope of the present disclosure.

Figure 8B:
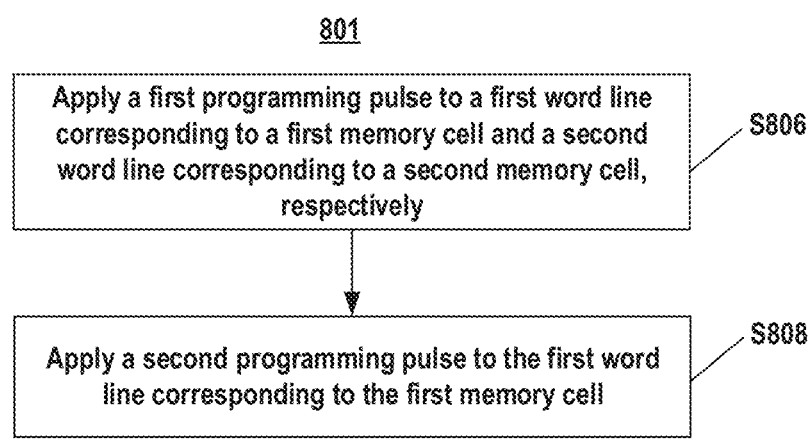
FIG. 8B illustrates a flow diagram showing a second exemplary program operation method on a memory device, according to some implementations of the present disclosure.

FIG. 8B illustrates a flow diagram showing a second exemplary program operation method 801 on a memory device, according to some implementations of the present disclosure. As shown in FIG. 8B, for performing the first program operation on the first and second memory cells, at S806, a first programming pulse may be applied to a first word line corresponding to the first memory cell and a second word line corresponding to the second memory cell. The first word line may be connected to a control terminal of the first memory cell, and the second word line may be connected to a control terminal of the second memory cell. It can be understood that the application sequence and timing for the first programming pulse on the first and second memory cells may not be the major focus of the present disclosure. In other words, the first programming pulse may be applied to the first word line before applying to the second word line, or first applied to the second word line before applying to the first word line, and the present disclosure does not limit thereto.

Figure 9:
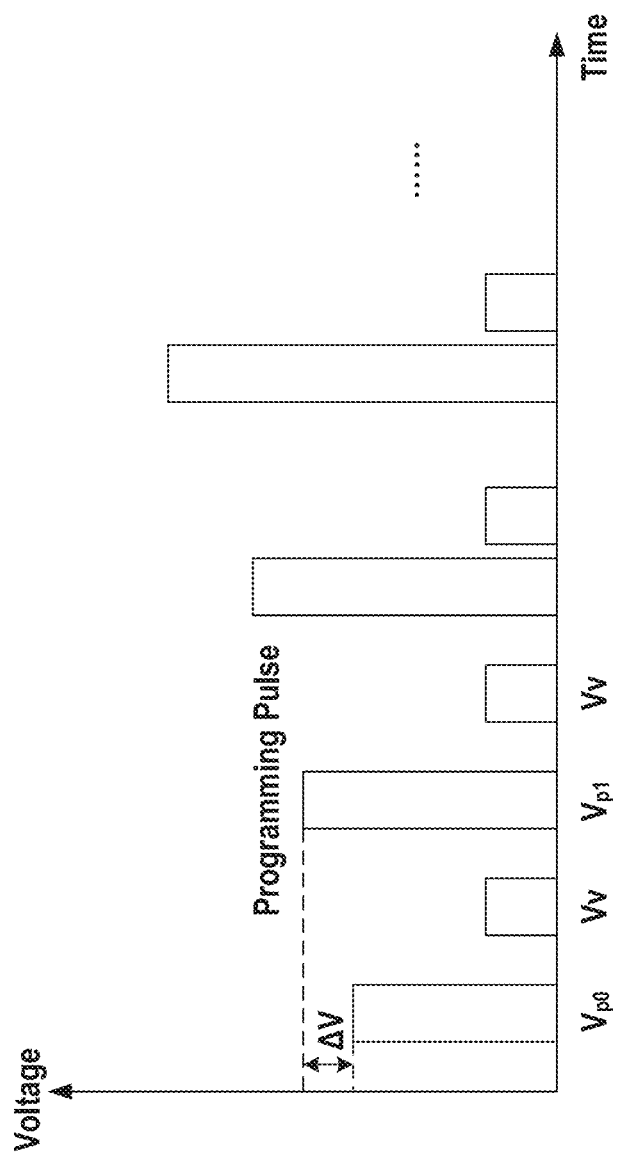
FIG. 9 illustrates a schematic diagram showing exemplary incremental-step-pulse programming, according to some implementations of the present disclosure.

Subsequently, at S808, for performing the second program operation on the first memory cell, a second programming pulse may be applied to the first word line corresponding to the first memory cell. In some implementations, the method for programming the first and second memory cells may include incremental-step-pulse programming (ISPP), as shown in FIG. 9. When data is required to be programmed into a memory cell, it may be first programmed with an initial voltage $V_{po}$ having a preset initial programming pulse. At the end of applying the programming pulse, the programmed memory cell may be verified with a verification voltage $V_v$ to determine whether the memory cell arrives at the correct programming state. In response to the memory cell not being programmed to the correct programming state, an adjustment value $\Delta V$ based on an incremental step pulse may be added to the initial pulse voltage $V_{po}$ as a new pulse voltage $V_{p1}$. Based on the new pulse voltage $V_{p1}$ for another pulse duration, a new cycle (or a new round) of programming and verification may be performed on the same memory cell, until the memory cell is programmed to the correct programming state, at which the second program operation may be recognized as "successful." In some implementations, verification voltage $V_v$ may be lower than each of initial programming voltage $V_{po}$ and new pulse voltage $V_{p1}$.

Based on FIG. 9, a memory cell can be programmed through multiple programming pulses to reach the desired programming state. It can be understood that the correct programming state of a memory cell may be determined according to the practical requirement, and the number of programming repetitions can be accordingly determined based on the desired programming state. In view of the technical skills provided by FIG. 9, it can be understood that the term "a programming pulse" used herein may not limit to only one programming pulse and may accordingly refer to one or more programming pulses.

In some implementations, at least one state of the memory cell may be verified after each programming pulse. For example, for an MLC memory cell, there are four corresponding states, i.e., the erase state "11," the first state "10," the second state "01," and the third state "00." In the process of programming the memory cell to the first state "10," through one or more programming pulses, the first state "10," the second state "01," and the third state "00" may be verified upon each programming pulse.

In some implementations, the first program operation may include at least one first programming pulse, and the second program operation may include at least one second programming pulse that corresponds to the at least one first programming pulse. In one example, the at least one second programming pulse may be substantially identical to the at least one first programming pulse, and a second target programming state achieved by the second program operation on the first memory cell can be substantially identical to a first target programming state achieved by the first program operation on the first memory cell. The term "identical" used herein may describe that at least one of the first pulse voltage being substantially identical to the second pulse voltage or the first pulse duration being substantially identical to the second pulse duration is satisfied.

In the process of performing the first program operation, the at least one first programming pulse may be applied to the first memory cell, such that the first memory cell can reach the target programming state. The first programming pulse may include a first pulse voltage $V_1$ and a first pulse duration $T_1$. On the other hand, in the process of performing the second program operation, the second programming pulse that corresponds to the first programming pulse may be employed. The second programming pulse may include a second pulse voltage $V_2$ and a second pulse duration $T_2$. In some implementations, at least a portion of the first programming pulse may be the same as the second programming pulse. The term "at least a portion of the first programming pulse being the same to the second programming pulse" used herein may refer to a first case where the first pulse voltage $V_1$ is substantially identical to the second pulse voltage $V_2$, and the first pulse duration $T_1$ is also substantially identical to the second pulse duration $T_2$. The term "the same" may also refer to a second case where the first pulse voltage $V_1$ is substantially identical to the second pulse voltage $V_2$, but the first pulse duration $T_1$ may be different from the second pulse duration $T_2$. In a third case, it may refer to a scenario where the first pulse duration $T_1$ is substantially identical to the second pulse duration $T_2$, but the first pulse voltage $V_1$ may be different from the second pulse voltage $V_2$. It can be understood that when the first program operation includes multiple first programming pulses, the term "the same" used herein may describe that the second program operation may include the same number of multiple programming pulses in the first program operation. Further, in some examples, the first pulse voltage may include a first initial pulse voltage and one or more first incremental voltages, and the second pulse voltage may include a second initial pulse voltage and one or more second incremental voltages. Each of the first initial pulse voltage and the one or more first incremental voltages may be substantially identical to a corresponding one of the second initial pulse voltage and the one or more second incremental voltages.

In some implementations, the second target programming state achieved by the second program operation on the first memory cell may be the same as the first target programming state achieved by the first program operation on the first memory cell. Hence, based on the first program operation, the same steps can proceed for the second program operation, which can avoid redundant steps caused by adjusting the programming pulses. As a result, the effect of narrowing the threshold voltage can be efficiently obtained, thereby improving the reliability of the memory device.

Notwithstanding the above, it can also be understood that, in other implementations, the second programming pulse of the second program operation may be different from the first programming pulse of the first program operation. More specifically, at least one of the number of pulses used in programming, the pulse voltage in each programming pulse, or the pulse duration in each programming pulse may be different. Accordingly, it is also possible to obtain a target programming state of the first program operation substantially identical to that of the second program operation while narrowing the range of the threshold voltage.

With reference again to FIG. 2, as described above, at the end of programming, the charges, trapped in tunneling layer 204, may de-trap during a short time period and return to conductive channel 202. As a result, the threshold voltage distribution may become wider, further affecting the reliability of the memory device. Generally speaking, the time period is approximately in the order of microseconds (μs) to seconds. In some implementations, the present disclosure, therefore, provides still another program operation method, in which upon the end of the first program operation on the first memory cell and before performing the first program operation on the second memory cell, the second program operation may be sequentially performed on the first memory cell.

Figure 10:
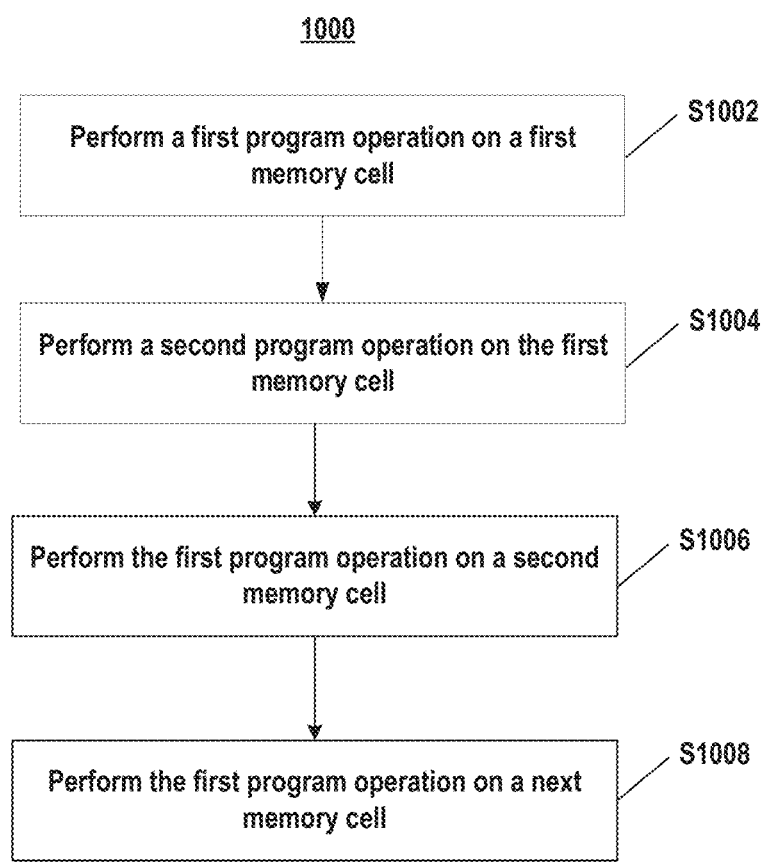
FIG. 10 illustrates a flow diagram showing a third exemplary program operation method on a memory device, according to some implementations of the present disclosure.

FIG. 10 illustrates a flow diagram showing a third exemplary program operation method 1000 on a memory device, according to some implementations of the present disclosure. As shown in FIG. 10, method 1000 may first proceed to S1002. A first program operation may be performed on a first memory cell at S1002. Subsequently, a second program operation may be performed on the same first memory cell at S1004. The first program operation may include a program operation performed on both the first memory cell and a second memory cell. The storage time of the data stored in the first memory cell may be longer than the storage time of the data stored in the second memory cell. In some examples, the storage time may be predetermined or pre-detected, so that the memory system can recognize whether a memory cell is a first memory cell or a second memory cell in advance of performing the second program operation.

In some implementations, the first program operation may include one or more programming and verification cycles, and each cycle may include a programming pulse and at least one verification operation. In some examples, the first program operation may be performed on a single first memory cell. For example, for an MLC memory cell, a verification voltage may be applied to a word line corresponding to the first memory cell upon the end of applying a programming pulse for programming the first state "10." If the verification passes, the first type data has been programmed into the first memory cell. That is, the first program operation on the first memory cell may be ended. In response to the memory controller receiving an instruction indicating that the first program operation on the first memory cell is ended, the memory controller may instruct the first memory cell to start the second program operation. On the other hand, in response to the verification has failed, the current programming pulse may need to, e.g., add an adjustment value ΔV in the incremental step pulse to be the new pulse voltage for the next verification cycle until the first memory cell is programmed to the first state "10." The second program operation may be performed after the first program operation on the first memory cell and before the first program being performed on the second memory cell.

Figure 11:
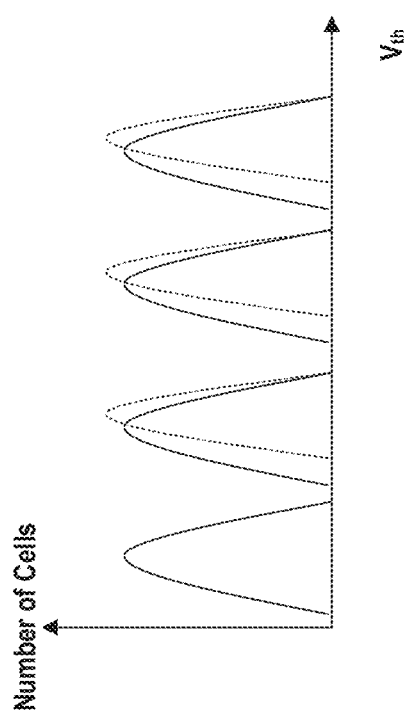
FIG. 11 illustrates a schematic diagram showing a concentrated threshold voltage distribution through employing program operation methods according to some implementations of the present disclosure.

FIG. 11 illustrates a schematic diagram showing a concentrated threshold voltage distribution through employing program operation methods according to some implementations of the present disclosure. In accordance with the scope of the present disclosure, upon the end of the first program operation on the first memory cell and before performing the first program operation on another memory cell, the second program operation may be performed on the first memory cell. The first program operation may be performed on the first memory cell that is configured to store the first type data (e.g., cold data) multiple times. As shown in FIG. 11, the corresponding threshold voltage range, from the solid curve to the dotted curve, may become narrower by employing the provided program operation methods. The first type data may be better maintained in the first memory cell, further reducing the bit error rate and improving the reliability of the memory device.

Continuing on FIG. 10, method 1000 may proceed to S1006, where the first program operation may be performed on the second memory cell. The first memory cell may be configured to store the first type data (e.g., cold data), and the second memory cell may be configured to store the second type data (e.g., hot data). The first storage time of the first type data may be longer than the second storage time of the second type data. In some examples, the storage time may be predetermined or pre-detected, so that the memory system can recognize whether a memory cell is a first memory cell or a second memory cell.

Further, at S1008, after the first program operation on the second memory cell is completed (or more specifically, being successful), the first program operation may be performed on the next memory cell. The next memory cell can be configured to store the first type data or the second type data. The first program operation may include a program operation performed on the first and second memory cells. After the first program operation on the first memory cell is completed (or more specifically, being successful), the second program operation may be sequentially performed on the first memory cell. Subsequently, the first program operation may be performed on the second memory cell. After the first program operation on the second memory cell is completed (or more specifically, being successful), the first program operation may be performed on the next memory cell.

In some implementations, upon the programming pulse being applied to the word line corresponding to the second memory cell, a verification operation may be performed on the second memory cell to determine whether the memory cell is in the correct programming state. In response to the second memory cell being programmed to the correct programming state, the first program operation may be performed on the next memory cell to be programmed. The first program operation on the next memory cell may be substantially identical to that performed on the second memory cell. In response to the second memory cell not being programmed to the correct programming state, an adjustment value ΔV based on the incremental step pulse may be added to the initial pulse voltage to be the new pulse voltage. Based on the new pulse voltage and pulse duration, a new cycle of programming and verification may be performed on the second memory cell until the second memory cell is programmed to the correct programming state, and the first program operation on the second memory cell may be ended.

In accordance with the scope of the present disclosure, a single memory cell may be individually programmed. When a memory cell to be programmed is a first memory cell, a second program operation may be required to improve the retention characteristics of the first memory cell. By contrast, when the memory cell to be programmed is a second memory cell, it may not need the second program operation, and the method may proceed to the next memory cell with the first program operation. The program operations may be repeated until each memory cell in the memory cell array is programmed to corresponding correct programming states.

Figure 12A:
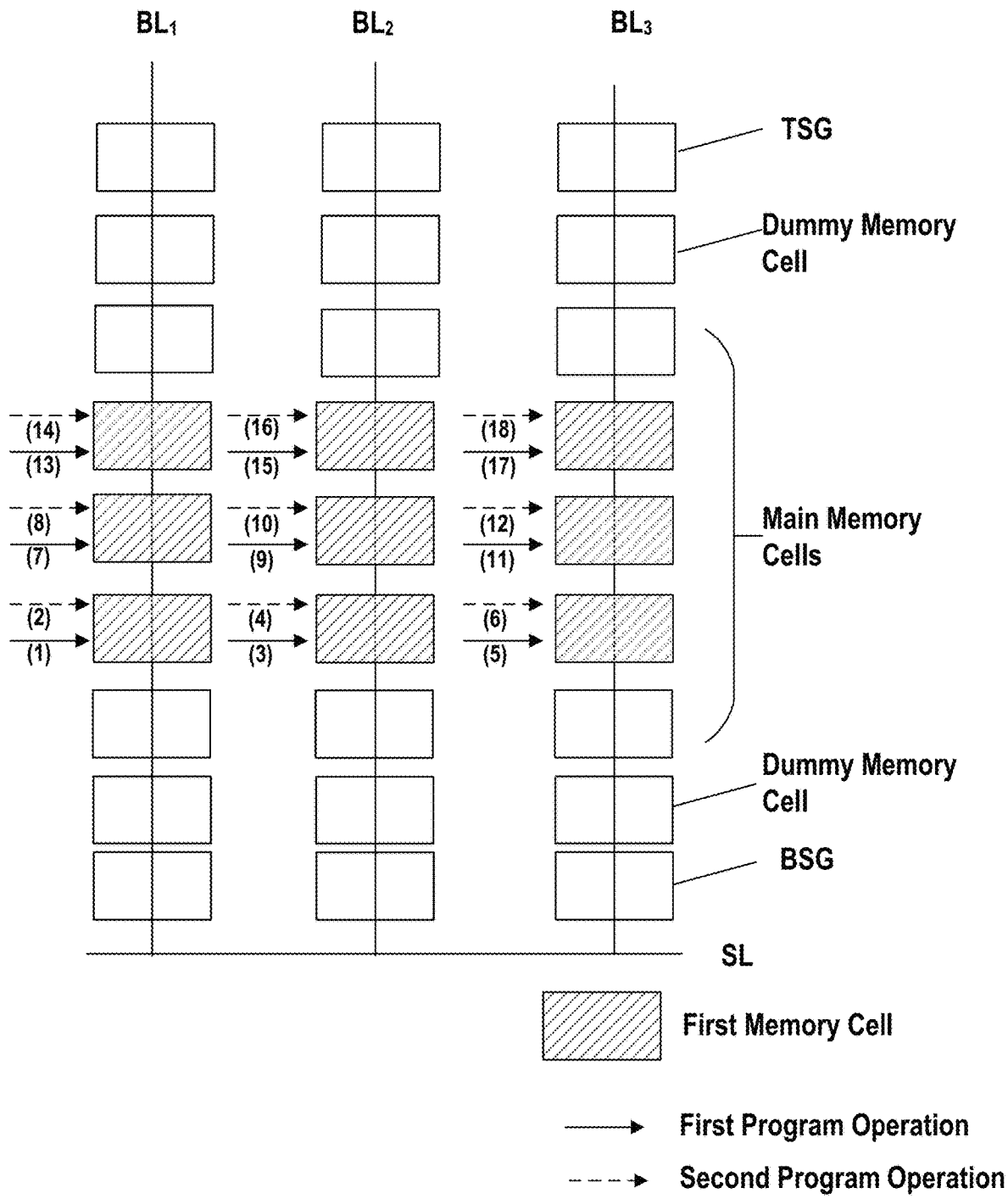
FIG. 12A illustrates a schematic diagram showing a first exemplary program operation scheme, according to some implementations of the present disclosure.

FIG. 12A illustrates a schematic diagram showing a first exemplary program operation scheme, according to some implementations of the present disclosure. The memory cell array may include a plurality of main memory cells. Each main memory cell may be formed in an intersection between a bit line BL and a word line WL. In some implementations, the plurality of main memory cells may include at least one first memory cell and at least one second memory cell. As shown in FIG. 12A, the first program operation may be performed based on a single or individual memory cell. After the first program operation on the first memory cell is completed (or more specifically, being successful), the second program operation may be subsequently performed on the same first memory cell.

The first program operation may include one or more programming and verification cycles. In some implementations, the first program operation may be the same as the second program operation. That is, at least one of the first pulse voltage being substantially identical to the second pulse voltage or the first pulse duration being substantially identical to the second pulse duration is satisfied. By applying the second programming pulse to the first word line corresponding to the first memory cell for the second pulse duration, the second program operation can be performed on the first memory cell. Meanwhile, a pass voltage may be applied to the second word line corresponding to the second memory cell so as to disable a programming function of the second memory cell while programming the first memory cell.

It can be appreciated that FIG. 12A merely provides an illustrative example to show that the first and second program operations may be sequentially performed on the same first memory cell. As shown in FIG. 12A, after the first program operation on the first memory cell is completed, the second program operation may be performed on the same first memory cell. The first program operation may proceed to another first memory cell, e.g., of the same word line, and the second program operation may be then performed on the other first memory cell, and so on. After each first memory cell in one word line is programmed with the first and second program operations, the process may proceed to the first memory cells in another word line, as shown in FIG. 12A; however, the present disclosure does not limit thereto. In other implementations, after the first program operation on the first memory cell is completed, the second program operation may be performed on the same first memory cell. The first program operation may proceed to another first memory cell, e.g., of the same bit line, and the second program operation may be then performed on the other first memory cell, and so on.

It can be understood that FIG. 12A can be employed in either FIG. 8A or 10. In the application with FIG. 8A, before performing the second program operation on the same first memory cell, the first program operation on the second memory cells, e.g., in the same bit line, may be performed first. On the other hand, in the application with FIG. 10, the second program operation on the first memory cell may be performed before the first program operation on the second memory cells. In other words, the order for performing the first and second program operations on the first memory cells, although being shown by consecutive numbers in FIG. 12A, may not be directly adjacent in the time domain. For example, in some implementations, one or more operations (e.g., a first program operation on a second memory cell) may be arranged between program operations of two consecutive numbers.

FIG. 12A shows some implementations in which the first and second program operations may be sequentially performed based on a single memory cell, from a lower selected word line toward an upper selected word line, in an upwards manner (also termed "forward programming") with respect to a source line SL (e.g., a common source line). However, the present disclosure does not limit thereto. In other implementations, the first and second program operations may be sequentially performed based on a single memory cell, from an upper selected word line to a lower selected word line, in a downwards manner (also termed "backward programming").

In some examples, the memory device may include a 3D NAND memory device. The memory cells of 3D NAND memory device may be formed by stacking a plurality of interleaved gate layers and dielectric layers. In the forward programming, a programming voltage can be applied sequentially from a selected word line at the bottom of the memory device to a selected word line at the top of the memory device. For example, a programming pulse is applied to a selected word line closest to a substrate, and a pass voltage may be applied to other unselected word lines. Subsequently, another programming pulse may be sequentially applied to the next selected word line, and another pass voltage may be applied to the other unselected word lines, until all programming is completed. Similarly, to perform the backward programming, another programming voltage can be applied sequentially from a selected word line at the top of the memory device to a selected word line at the bottom of the memory device.

Figure 12B:
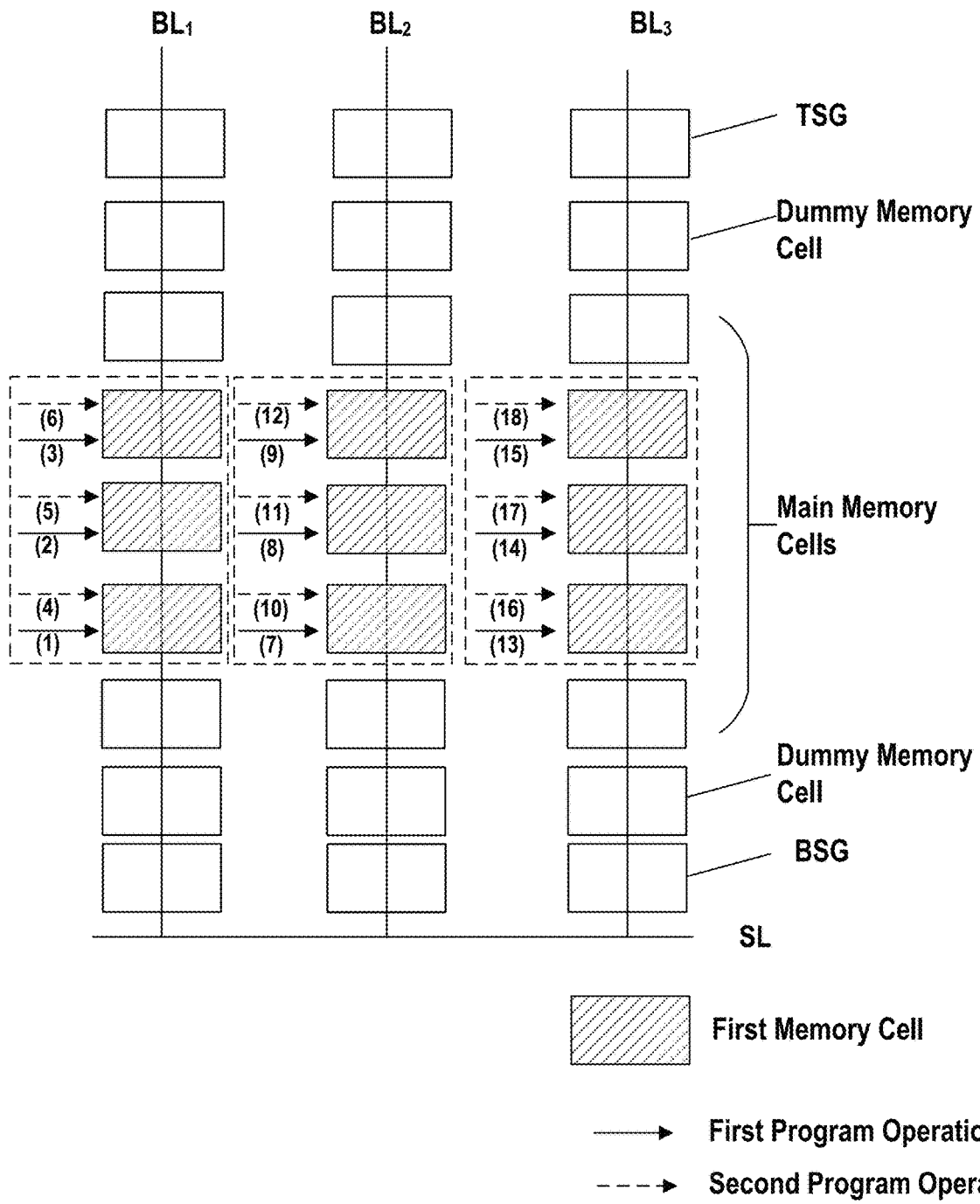
FIG. 12B illustrates a schematic diagram showing a second exemplary program operation scheme, according to some implementations of the present disclosure.

FIG. 12B illustrates a schematic diagram showing a second exemplary program operation scheme, according to some implementations of the present disclosure. The memory cell array may be divided into a plurality of memory strings, as shown by the dotted boxes in FIG. 12B. Each memory string may include a top selection gate TSG, a bottom selection gate BSG, at least one dummy memory cell, and a plurality of main memory cells. Although top selection gate TSG, bottom selection gate BSG, and the at least one dummy memory cell may not be configured to store data, with these cells, better control can be achieved in the process of programming the main memory cells. Hence, the data can be better maintained in a corresponding main memory cell.

Each memory cell, one of the at least one dummy memory cell and the main memory cells, may be formed in an intersection between a conductive channel and a corresponding word line. The plurality of main memory cells in one memory string may further include at least one of the first memory cell or the second memory cell. The term "one memory string" herein may be used to describe a bit line plane or a conductive channel.

In some implementations, the first and second program operations may be performed based on one memory string. As shown in FIG. 12B, once the first program operation on the first memory cells of one memory string is completed, the second program may be started on the first memory cells of the same memory string. The first program operation on the first memory cells may proceed to the next memory string after the first and second program operations have been completed on the current memory string. In some examples, the sequence of performing the first program operation in one memory string may be the same as the sequence of performing the second program operation in the same memory string.

It can also be appreciated that FIG. 12B merely provides an illustrative example in which the first and second program operations may be sequentially performed based on one single memory string, from a lower selected word line to an upper selected word line, in an upwards manner (also termed "forward programming") with respect to a source line SL (e.g., a common source line) or a substrate. However, the present disclosure does not limit thereto. In other implementations, the first and second program operations may be sequentially performed based on a single memory string, from an upper selected word line to a lower selected word line, in a downwards manner (also termed "backward programming").

In some implementations according to FIG. 12B, the first and second program operations can be performed based on one single memory string, while in other implementations, the first and second program operations may be performed on the basis of a plurality of memory strings. For example, after the first program operation is completed on the first memory cells in two memory strings, the second program operation on the first memory cells may proceed to the same two memory strings.

It can also be understood that FIG. 12B can be employed in either FIG. 8A or 10. In the application with FIG. 8A, before performing the second program operation on the first memory cells of the same memory string, the first program operation on the second memory cells of the same memory string may be performed first. On the other hand, in the application with FIG. 10, the second program operation on the first memory cells may be performed before the first program operation on the second memory cells of the same memory string. In other words, the order for performing the first and second program operations on the first memory cells, although being shown by consecutive numbers for one memory string in FIG. 12B, may not be directly adjacent in the time domain.

Figure 12C:
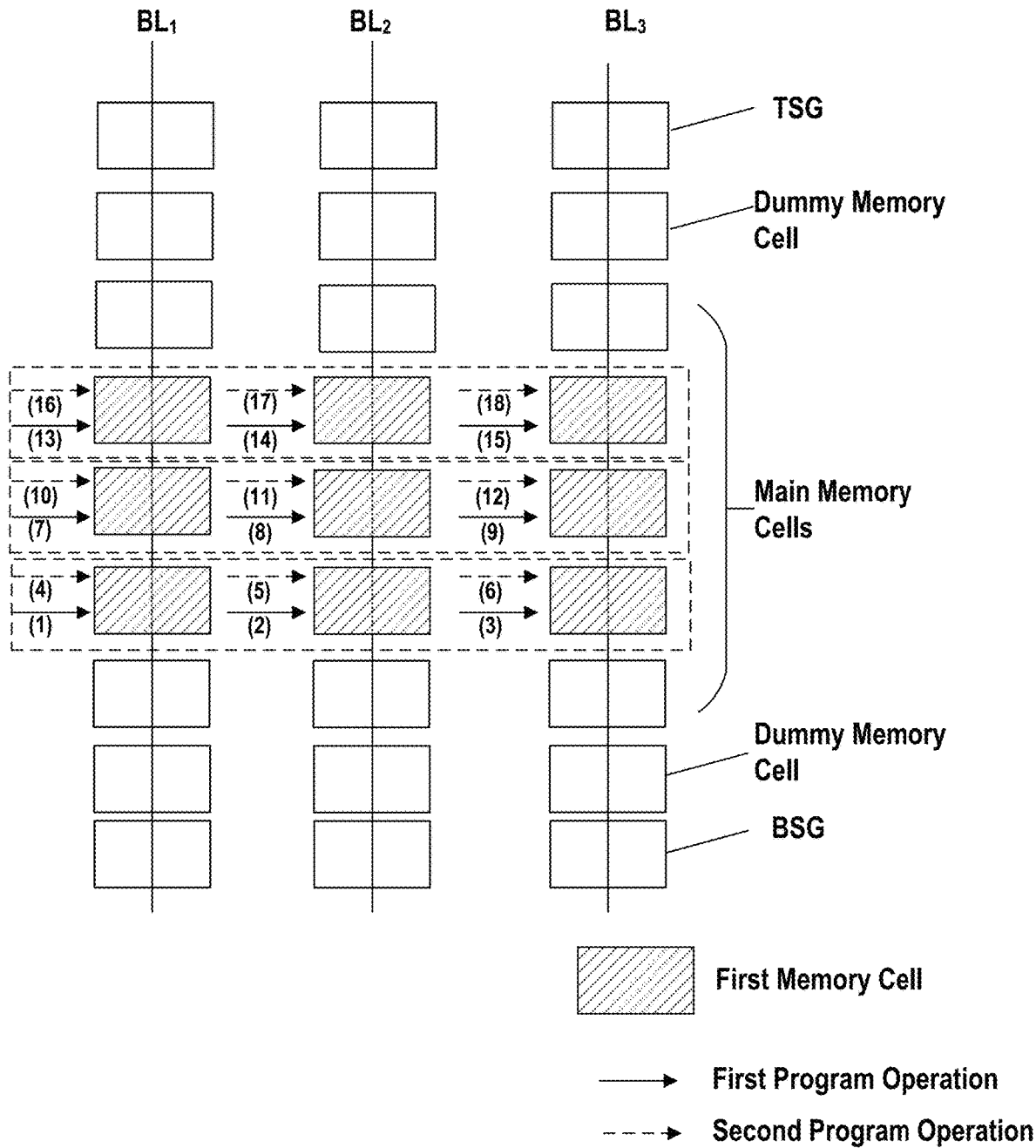
FIG. 12C illustrates a schematic diagram showing a third exemplary program operation scheme, according to some implementations of the present disclosure.

FIG. 12C illustrates a schematic diagram showing a third exemplary program operation scheme, according to some implementations of the present disclosure. In some implementations, the memory cell array may be divided into a plurality of memory pages, as shown by the dotted boxes in FIG. 12C. Each memory page may include a plurality of main memory cells. The plurality of main memory cells in one page may further include at least one of the first memory cell or the second memory cell. The term "one page" herein may be used to refer to a word line plane, and each main memory cell may be formed between the word line plane and a conductive channel.

In some implementations, the first and second program operations may be performed based on one memory page. As shown in FIG. 12C, after the first program operation on the first memory cells of one page is completed, the second program on the same first memory cells may be started on the same page. The first program operation on other first memory cells may proceed to the next page after the first and second program operations have been completed on the current memory page. In some examples, the sequence of performing the first program operation on one page may be the same as the sequence of performing the second program operation on the same page. Although FIG. 12C shows the forward programming, in some implementations, the backward programming may be employed, to which the present disclosure does not limit. Further, although FIG. 12C shows some implementations in which the first and second program operations are performed based on a single page, in other implementations, the first and second program operations may be performed on the basis of a plurality of pages. For example, until the first program operation is completed on the first memory cells of two pages, the second program operation may not proceed to the same two pages.

It can also be understood that FIG. 12C can be employed in either FIG. 8A or 10. In the application with FIG. 8A, before performing the second program operation on the first memory cells of the same memory page, the first program operation on the second memory cells of the same memory page may be performed first. On the other hand, in the application with FIG. 10, the second program operation on the first memory cells may be performed before the first program operation on the second memory cells of the same memory page. In other words, the order for performing the first and second program operations on the first memory cells, although being shown by consecutive numbers for one memory string in FIG. 12C, may not be directly adjacent in the time domain.

Figure 12D:
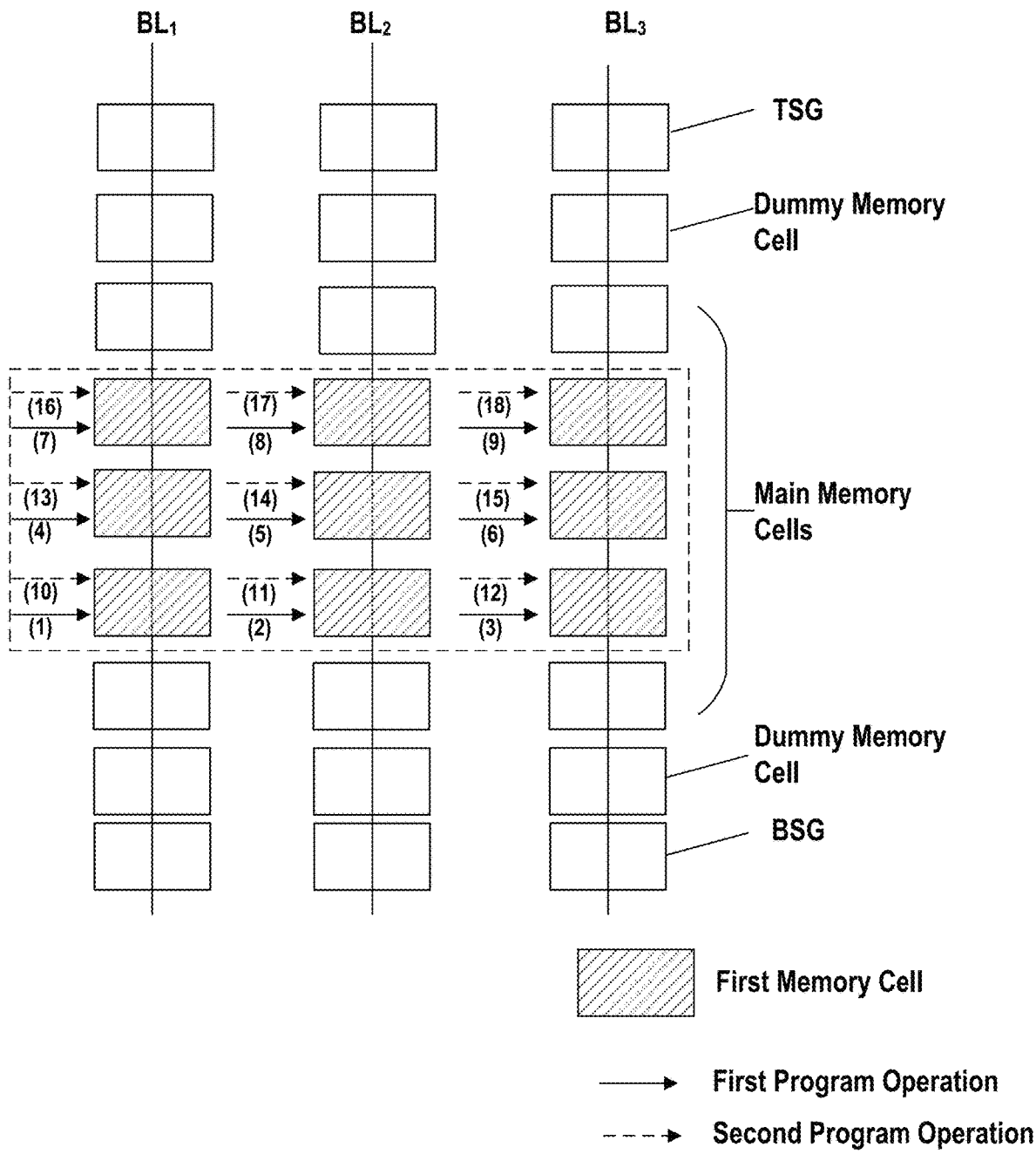
FIG. 12D illustrates a schematic diagram showing a fourth exemplary program operation scheme, according to some implementations of the present disclosure.

FIG. 12D illustrates a schematic diagram showing a fourth exemplary program operation scheme, according to some implementations of the present disclosure. The memory cell array may be divided into a plurality of blocks, as shown by the dotted boxes in FIG. 12D. Each block may include a plurality of main memory cells. The plurality of main memory cells in one block may further include at least one of the first memory cell or the second memory cell. The term "one block" herein may be equivalent to or similar to memory block 603 defined in FIG. 6.

In some implementations, the first and second program operations may be performed based on one block. As shown in FIG. 12D, after the first program operation on first memory cells of a block is completed, the second program on the same first memory cells may be started on the same block. The first program operation on other first memory cells may proceed to the next block after the first and second program operations have been completed on the current block. In some examples, the sequence of performing the first program operation in one block may be the same as the sequence of performing the second program operation in the same block. Again, although FIG. 12D shows the forward programming, in some implementations, the backward programming may be applied, to which the present disclosure does not limit.

It can also be understood that FIG. 12D can be employed in either FIG. 8A or 10. In the application with FIG. 8A, before performing the second program operation on the first memory cells of the same block, the first program operation on the second memory cells of the same block may be performed first. On the other hand, in the application with FIG. 10, the second program operation on the first memory cells may be performed before the first program operation on the second memory cells of the same block. In other words, the order for performing the first and second program operations on the first memory cells, although being shown by consecutive numbers for one memory string in FIG. 12D, may not be directly adjacent in the time domain.

As shown in FIGS. 12B-D, in some implementations, upon the first program operation is completed on multiple first memory cells based on one memory string, one memory page, or one block, the second program operation on these first memory cells may be performed. As such, the programming and verification can be performed on the multiple first memory cells simultaneously. Consequently, the programming time can be effectively reduced to ensure programming efficiency while providing satisfactory memory storage.

The first program operation may include one or more programming and verification cycles. In some implementations, the first program operation may be the same as the second program operation. That is, at least one of the first pulse voltage being substantially identical to the second pulse voltage or the first pulse duration being substantially identical to the second pulse duration is satisfied. By applying the second programming pulse to the first word line corresponding to the first memory cell for the second pulse duration, the second program operation can be performed on the first memory cell. Meanwhile, a pass voltage may be applied to the second word line corresponding to the second memory cell to disable a programming function of the second memory cell.

In some implementations, a programming pulse may be applied to a first word line corresponding to the first memory cell to obtain the second program operation on the first memory cell. At the end of applying the programming pulse on the first memory cell, a verification voltage may be performed on the same word line for the verification operation. The verification operation may be configured to determine whether the first memory cell has entered the correct programming state. Similarly, another programming pulse may be applied to a second word line corresponding to the second memory cell to perform the first program operation on the second memory cell. At the end of applying the programming pulse to the second memory cell, another verification voltage may be performed on the second word line for the verification operation on the second memory cell. The verification operation may be configured to determine whether the second memory cell has entered the correct programming state.

The verification operation may include pre-charging, development, and readout phases. The pre-charging phase can be obtained by applying a voltage to a bit line through, e.g., voltage generator 710 or a sensing amplifier, so that a voltage difference between the bit line and the substrate can be generated. The threshold voltage of the memory cell can be detected according to a voltage change so as to determine whether the correct programming state is reached. The development phase may correspond to the process of discharging or maintaining the voltage, which is the stage used to determine whether the verification has passed. The readout phase is used to read out a verification state and store the verification state in, e.g., registers through sensors connected with the bit line for subsequent data exchange with the memory controller.

In some implementations, in response to the threshold voltage, corresponding to a memory cell, being greater than the verification voltage, it may be determined that the memory cell has reached the correct programming state. On the other hand, in response to the threshold voltage being less than the verification voltage, it may be determined that the memory cell has not reached the correct programming state, and the next cycle of programming and verification cycle may be required.

In accordance with the scope of the present disclosure, the first memory cell will undergo the first and second program operations. The verification operation can be performed according to practical applications and requirements. In some implementations, at the end of the first program operation, the verification voltage may be applied to a corresponding word line of the first memory cell, undergoing the precharging, development, and readout phase, to verify the programming state. In some implementations, upon the first and second program operations are completed on the first memory cell, the verification voltage may be applied to a corresponding word line of the first memory cell to verify the programming state. In some implementations, at the end of the first program operation and at end of the second program operation, verification operations may be respectively performed. The first verification voltage may be applied in the first verification operation, and the second verification voltage may be applied in the second verification operation. In some examples, the first verification voltage may be the same as the second verification.

In view of the above, based on the sequential program operation on the memory cells, the programming accuracy can be enhanced. That is, the threshold voltage distribution of a single memory cell can be effectively improved, thus improving the reliability of the memory device.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations but should be defined only in accordance with the following claims and their equivalents.

What is claimed is:

1. A memory device, comprising:
  a memory cell array comprising one or more first memory cells configured to store first type data for a first storage time, and one or more second memory cells configured to store second type data for a second storage time; and
  peripheral circuits coupled to the memory cell array and configured to:
    perform a first program operation on the one or more first memory cells;
    perform the first program operation on the one or more second memory cells; and
    perform a second program operation on the one or more first memory cells,
  wherein the first storage time corresponding to the first type data is longer than the second storage time corresponding to the second type data.

2. The memory device of claim 1, wherein the second program operation is configured to adjust a threshold voltage range corresponding to the one or more first memory cells to become narrower than in the first program operation.

3. The memory device of claim 1, wherein:
  a first target programming state achieved by the first program operation on the one or more first memory cells is substantially identical to a second target programming state achieved by the second program operation on the one or more first memory cells.

4. The memory device of claim 1, wherein:
  the first program operation comprises a first programming pulse that includes a first pulse voltage and a first pulse duration, and the second program operation comprises a second programming pulse that includes a second pulse voltage and a second pulse duration; and
  at least one of the first pulse voltage being substantially identical to the second pulse voltage or the first pulse duration being substantially identical to the second pulse duration is satisfied.

5. The memory device of claim 4, wherein:
  the first pulse voltage comprises a first initial pulse voltage and one or more first incremental voltages, and the second pulse voltage comprises a second initial pulse voltage and one or more second incremental voltages; and
  each of the first initial pulse voltage and the one or more first incremental voltages is substantially identical to a corresponding one of the second initial pulse voltage and the one or more second incremental voltages.

6. The memory device of claim 1, wherein the peripheral circuits are configured to:
  apply a programming voltage to a word line corresponding to the one or more first memory cells, and a pass voltage to other word lines corresponding to the one or more second memory cells to perform the first program operation on the one or more first memory cells.

7. The memory device of claim 1, wherein the peripheral circuits are configured to:
  perform the first program operation on the one or more first memory cells and the first program operation on the one or more second memory cells sequentially or parallelly.

8. The memory device of claim 1, wherein:
  the one or more first memory cells comprise a plurality of first memory cells; and
  the peripheral circuits are configured to:
    verify whether the first program operation on at least one first memory cell of the plurality of first memory cells is successful based on applying a verification voltage to a word line corresponding to the at least one first memory cell; and
    after a determination that the first program operation on the at least one first memory cell is successful, perform the second program operation on the at least one first memory cell.

9. The memory device of claim 1, wherein:
  the one or more first memory cells comprise a plurality of first memory cells in one memory string; and
  the peripheral circuits are configured to:
    after the first program operation on the plurality of first memory cells in the memory string is successful, perform the second program operation on the plurality of first memory cells in the memory string.

10. The memory device of claim 1, wherein:
the one or more first memory cells comprise a plurality of first memory cells in one memory page; and
the peripheral circuits are configured to:
after the first program operation on the plurality of first memory cells in the memory page is successful, perform the second program operation on the plurality of first memory cells in the memory page.

11. The memory device of claim 1, wherein:
the one or more first memory cells comprise a plurality of first memory cells in one block; and
the peripheral circuits are configured to:
after the first program operation on the plurality of first memory cells in the block is successful, perform the second program operation on the plurality of first memory cells in the block.

12. A memory system, comprising:
one or more memory devices, each comprising:
a memory cell array that comprises one or more first memory cells configured to store first type data for a first storage time, and one or more second memory cells configured to store second type data for a second storage time; and
peripheral circuits coupled to the memory cell array; and
a memory controller coupled to the one or more memory devices and configured to send a programming instruction signal to one of the one or more memory devices,
wherein in response to the programming instruction signal, the peripheral circuits of a corresponding memory device are configured to:
perform a first program operation on the one or more first memory cells;
perform the first program operation on the one or more second memory cells; and
perform a second program operation on the one or more first memory cells,
wherein the first storage time corresponding to the first type data is longer than the second storage time corresponding to the second type data.

13. A method for programming data, comprising:
performing a first program operation on one or more first memory cells and performing the first program operation on one or more second memory cells, the one or more first memory cells being configured to store first type data for a first storage time, and the one or more second memory cells being configured to store second type data for a second storage time; and
performing a second program operation on the one or more first memory cells,
wherein the first storage time corresponding to the first type data is longer than the second storage time corresponding to the second type data.

14. The method of claim 13, wherein the second program operation is configured to adjust a threshold voltage range corresponding to the one or more first memory cells to become narrower than in the first program operation.

15. The method of claim 13, wherein:
a first target programming state achieved by the first program operation on the one or more first memory cells is substantially identical to a second target programming state achieved by the second program operation on the one or more first memory cells.

16. The method of claim 15, wherein:
the first program operation comprises a first programming pulse that includes a first pulse voltage and a first pulse duration, and the second program operation comprises a second programming pulse that includes a second pulse voltage and a second pulse duration; and
at least one of the first pulse voltage being substantially identical to the second pulse voltage or the first pulse duration being substantially identical to the second pulse duration is satisfied.

17. The method of claim 16, wherein:
the first pulse voltage comprises a first initial pulse voltage and one or more first incremental voltages, and the second pulse voltage comprises a second initial pulse voltage and one or more second incremental voltages; and
each of the first initial pulse voltage and the one or more first incremental voltages is substantially identical to a corresponding one of the second initial pulse voltage and the one or more second incremental voltages.

18. The method of claim 17, further comprising:
after applying each of the first initial pulse voltage and the one or more first incremental voltages to the one or more first memory cells, applying a verification voltage to a word line corresponding to the one or more first memory cells to verify whether the first program operation on the one or more first memory cells is successful to enable the one or more first memory cells to reach the first target programming state.

19. The method of claim 13, further comprising:
applying a programming voltage to a word line corresponding to the one or more first memory cells, and a pass voltage to other word lines corresponding to the one or more second memory cells to perform the first program operation on the one or more first memory cells.

20. The method of claim 13, wherein performing the first program operation on the one or more first memory cells and the one or more second memory cells comprises performing the first program operation on the one or more first memory cells and the first program operation on the one or more second memory cells sequentially or parallelly.

* * * * *